US012757798B2

(12) United States Patent
Chan et al.

(10) Patent No.: US 12,757,798 B2
(45) Date of Patent: Oct. 6, 2026

(54) SEMICONDUCTOR DEVICES AND METHODS OF MAKING SEMICONDUCTOR DEVICES HAVING EMBEDDED PHOTONIC BRIDGE DIE

(71) Applicant: STATS ChipPAC Pte. Ltd., Singapore (SG)

(72) Inventors: Kai Chong Chan, Singapore (SG); Linda Pei Ee Chua, Singapore (SG); Yaojian Lin, Jiangyin (CN); Swain Hong Alfred Yeo, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 352 days.

(21) Appl. No.: 18/629,654

(22) Filed: Apr. 8, 2024

(65) Prior Publication Data

US 2025/0316659 A1 Oct. 9, 2025

(51) Int. Cl.

| | |
|---|---|
| ***H10W 90/00*** | (2026.01) |
| ***H10W 20/20*** | (2026.01) |
| ***H10W 70/09*** | (2026.01) |
| ***H10W 74/01*** | (2026.01) |
| ***H10W 74/10*** | (2026.01) |
| ***H10W 74/15*** | (2026.01) |

(52) U.S. Cl.

CPC ........... *H10W 90/00* (2026.01); *H10W 20/20* (2026.01); *H10W 74/01* (2026.01); *H10W 74/121* (2026.01); *H10W 70/09* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | | |
|---|---|---|---|---|
| 11,855,054 | B2 | 12/2023 | Pan et al. | |
| 12,616,067 | B2 * | 4/2026 | Lee | H10W 90/00 |
| 2023/0080454 | A1 * | 3/2023 | Pietambaram | G02B 6/12004 385/14 |
| 2025/0112092 | A1 * | 4/2025 | Sounart | H10P 95/11 |
| 2025/0112188 | A1 * | 4/2025 | Dogiamis | H10W 70/611 |
| 2025/0132291 | A1 * | 4/2025 | Yang | H05K 1/111 |
| 2025/0149454 | A1 * | 5/2025 | Chua | H10W 70/093 |
| 2025/0329624 | A1 * | 10/2025 | Chua | H10W 70/095 |
| 2025/0329681 | A1 * | 10/2025 | Lee | H10P 72/74 |
| 2026/0123472 | A1 * | 4/2026 | Lee | H10W 70/614 |

* cited by examiner

*Primary Examiner* — Michael Lebentritt

(74) *Attorney, Agent, or Firm* — Brian M. Kaufman; Robert D. Atkins; PATENT LAW GROUP: Atkins and Associates, P.C.

(57) ABSTRACT

A semiconductor device has a bridge die including a photonic circuit. An optical epoxy is deposited over the photonic circuit. The bridge die is disposed over a first interconnect structure. An encapsulant is deposited over the bridge die and first interconnect structure. A portion of the encapsulant is removed to expose the optical epoxy. A second interconnect structure is formed over the encapsulant with an opening in the second interconnect structure over the photonic circuit and optical epoxy. A first semiconductor die and second semiconductor die are disposed over the second interconnect structure. The first semiconductor die is electrically coupled to the second semiconductor die through the bridge die.

25 Claims, 22 Drawing Sheets

SEMICONDUCTOR DEVICES AND METHODS OF MAKING SEMICONDUCTOR DEVICES HAVING EMBEDDED PHOTONIC BRIDGE DIE

FIELD OF THE INVENTION

The present invention relates in general to semiconductor devices and, more particularly, to semiconductor devices and methods of making semiconductor devices having embedded photonic bridge die.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices may contain multiple electrical components, e.g., one or more semiconductor die and myriad discrete components to support the semiconductor die, disposed on one or more substrates to perform necessary electrical functions. Highly integrated packages with several components are commonly referred to as system-in-package (SiP) modules. SiP modules often have multiple semiconductor die that must communicate with each other at high bandwidths. Conductive traces formed at the package level may be insufficient to support the necessary bandwidth.

Many SiP modules utilize bridge die to facilitate high-bandwidth communication between components. Bridge die are semiconductor die that may have no circuits formed in their active surface but have fine-pitched interconnects formed over them. Bridge die can be disposed between two or more other semiconductor die, then the adjacent semiconductor die are connected to each other through the bridge die to increase the available data bandwidth between them.

Some bridge die include photonic circuits. Photonic circuits are light-sensitive to add important functionality to the end units. However, photonic circuits also add significant design constraints to the semiconductor packages being formed because the photonic circuit must be exposed to the outside world to allow the intended stimulus to reach the photonic circuit. Therefore, a need exists for manufacturing methods and device structures that allow the photonic circuits of embedded bridge die to be exposed in a final package.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements assigned the same reference number in the figures have a similar function to each other. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are disposed on a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
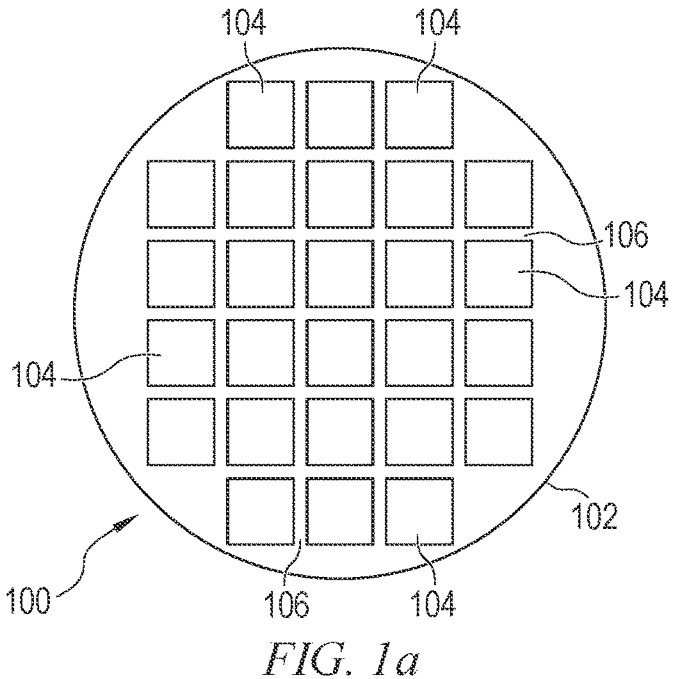
FIGS. 1*a*-1*c* illustrate a semiconductor wafer with a plurality of photonic bridge die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die, bridge die, photonic bridge die, or other components 104 is formed on wafer 100 separated by a non-active, inter-die wafer area or saw street 106. Saw street 106 provides cutting areas to singulate semiconductor wafer 100 into individual photonic bridge die 104. In one embodiment, semiconductor wafer 100 has a width or diameter of 100-450 millimeters (mm). Wafer 100 can include hundreds or thousands of photonic bridge die 104.

Figure 1B:
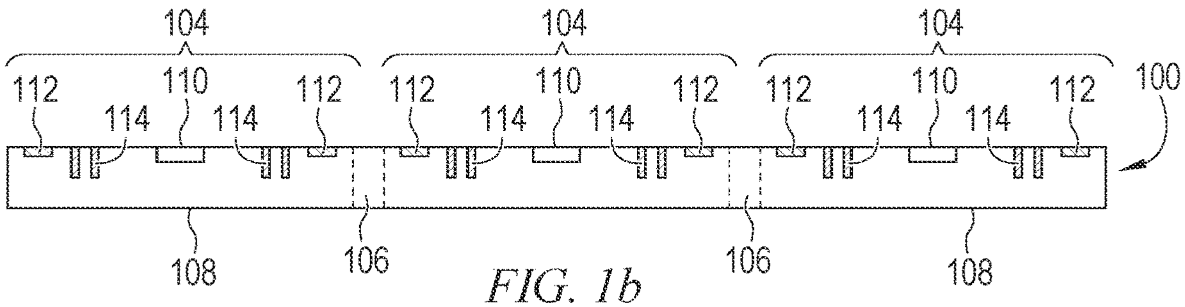

FIG. 1*b* shows a cross-sectional view of a portion of semiconductor wafer 100. Each photonic bridge die 104 has a back or non-active surface 108 and an active surface including a photonic circuit 110 formed within the die. The active surface may also include one or more transistors, diodes, and other circuit elements formed within the active surface to implement analog circuits or digital circuits, such as a digital signal processor (DSP), an application specific integrated circuit (ASIC), memory, or other signal processing circuit. Photonic bridge die 104 may also contain IPDs, such as inductors, capacitors, and resistors, for RF signal processing.

Wafer 100 is a wafer of photonic bridge die 104 as delivered by a manufacturer of the wafer to a manufacturer of semiconductor packages that will include the bridge die. The manufacturer of wafer 100 has formed an interconnect structure over the active surface including contact pads 112 for external interconnect and conductive vias 114 formed into photonic bridge die 104 for vertical interconnect through the bridge die. The interconnect structure with contact pads 112 also includes fine-pitched conductive traces, e.g., less than two micrometers (microns) in both line width and spacing between the lines that electrically connect contact pads on opposing sides of the bridge die to each other. The interconnect structure may have one or more than one layer of conductive traces with insulating layers formed between the layers. The interconnect structure also electrically interconnects photonic circuit 110, contact pads 112, and conductive vias 114 per the intended functionality of photonic bridge die 104.

The conductive layers, including contact pads 112, are formed over wafer 100 using physical vapor deposition (PVD), chemical vapor deposition (CVD), electrolytic plating, electroless plating, or another suitable metal deposition process. The conductive layers can be one or more layers of aluminum (Al), copper (Cu), tin (Sn), nickel (Ni), gold (Au), silver (Ag), or other suitable electrically conductive material. Any conductive layer mentioned above or below can be formed of the same methods and materials. Contact pads 112 include an under-bump metallization (UBM) in some embodiments.

Figure 1C:
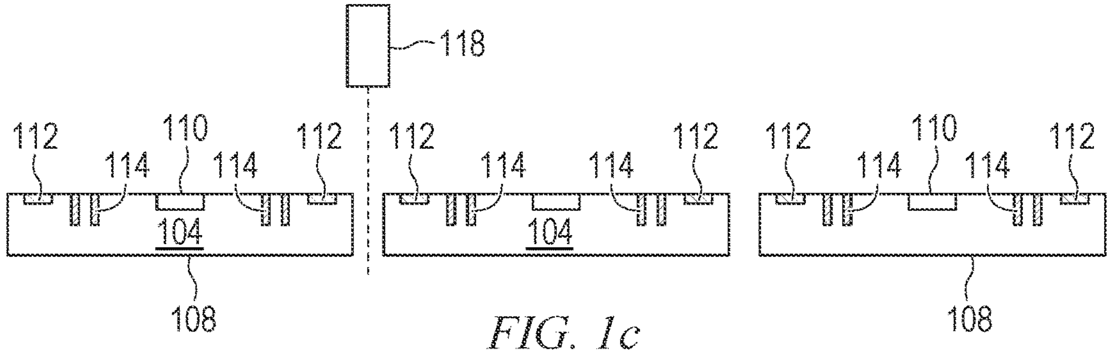

In FIG. 1*c*, semiconductor wafer 100 is singulated through saw street 106 using a saw blade or laser cutting tool 118 into individual photonic bridge die 104. The individual photonic bridge die 104 can be inspected and electrically tested for identification of known good die (KGD) or known good unit (KGU) after singulation.

FIGS. 2*a*-2*i* illustrate preparation of photonic bridge die 104 by a semiconductor package manufacturer after wafer 100 is delivered by the wafer manufacturer and, typically, before singulation in FIG. 1*c*. While only a single photonic bridge die 104 is shown in FIGS. 2*a*-2*i* to better illustrate important details, the illustrated steps are commonly performed at the wafer 100 level before singulation.

Figure 2A:
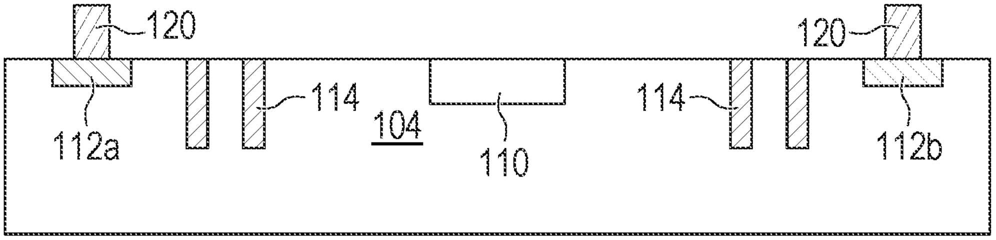
FIGS. 2*a*-2*i* illustrate preparing the photonic bridge die for inclusion in a system-in-package module.

In FIG. 2*a*, conductive microposts, microbumps, or micropillars 120 are formed on contact pads 112 of photonic bridge die 104 to facilitate external interconnection. Micropillars 120 are typically formed by depositing conductive material into openings of a photolithographic layer and then removing the photolithographic layer. The metal can be any of the materials mentioned above for conductive layers. In one embodiment, micropillars 120 have a copper core with a Ti/Cu plating 30 microns thick. Micropillars 120 represent just one possible interconnect method. Other embodiments use bond wires, conductive paste, stud bumps, solder bumps, or any other suitable type of electrical interconnect. A passivation layer is formed over wafer 100 prior to forming conductive pillars 120 in some embodiments, and then the conductive pillars are formed in openings of the passivation layer.

FIG. 2*a* illustrates that photonic bridge die 104 has contact pads 112*a* on one side of the die and contact pads 112*b* on the opposite side of the die. The bridge aspect of photonic bridge die 104 indicates that one use of the photonic bridge die is to operate as a bridge between two other semiconductor die to be described below. One additional semiconductor die is disposed over or adjacent to contact pads 112*a* and a second additional semiconductor die is disposed over or adjacent to contact pads 112*b*. Photonic bridge die 104 has a fine-pitched interconnect structure with conductive traces that electrically couple contact pads 112*a* to contact pads 112*b*, and thereby the two overlying semiconductor die to each other. One or both overlying die are also coupled to photonic circuit 110 to allow access to the photonic functionality.

Figure 2B:
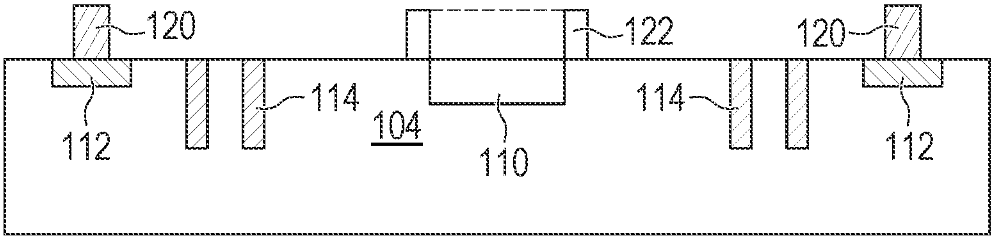
Figure 2C:
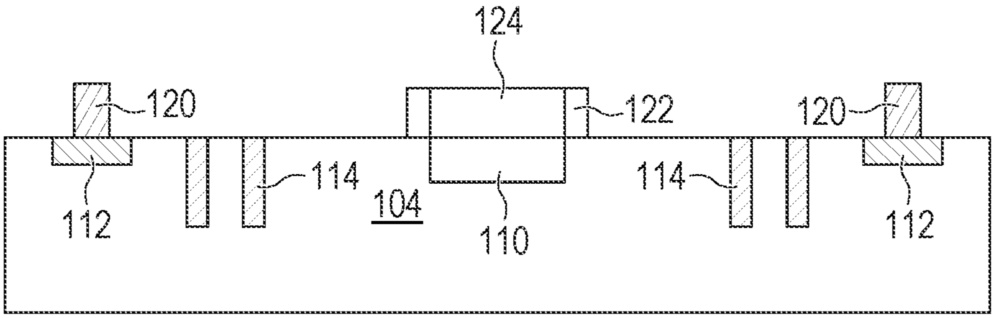

In FIG. 2*b*, a dam 122 is disposed or formed on photonic bridge die 104. Dam 122 forms a continuous path over and around photonic circuit 110 in plan view. Dam 122 can be pre-formed and mounted onto photonic bridge die 104 with a pick and place machine and an adhesive, or the dam can be formed of photoresist or another suitable material directly on photonic bridge die 104. In FIG. 2*c*, a clear epoxy 124 is deposited into the space within dam 122. Epoxy 124 is translucent or transparent to allow light to travel through the epoxy and act as a stimulus on photonic circuit 110. Epoxy 124 is deposited as a liquid, gel, or other similar fluidic material and then cured if necessary. Epoxy 124 acts as a window for optical protection of photonic circuit 110.

Figure 2D:
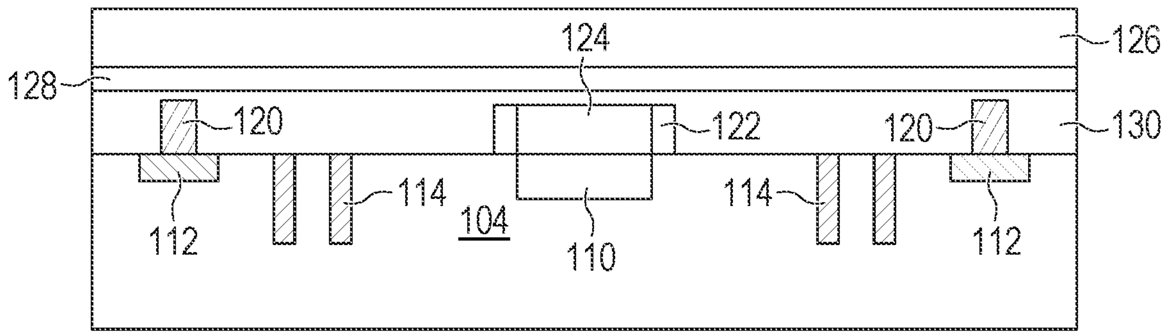

In FIG. 2*d*, a carrier or temporary substrate 126 containing sacrificial base material such as silicon, polymer, beryllium oxide, glass, or other suitable low-cost, rigid material for structural support is mounted onto wafer 100 over photonic circuit 110. Carrier 126 has a laser release coat 128 and an adhesive layer 130 to releasably adhere the carrier to photonic bridge die 104.

Figure 2E:
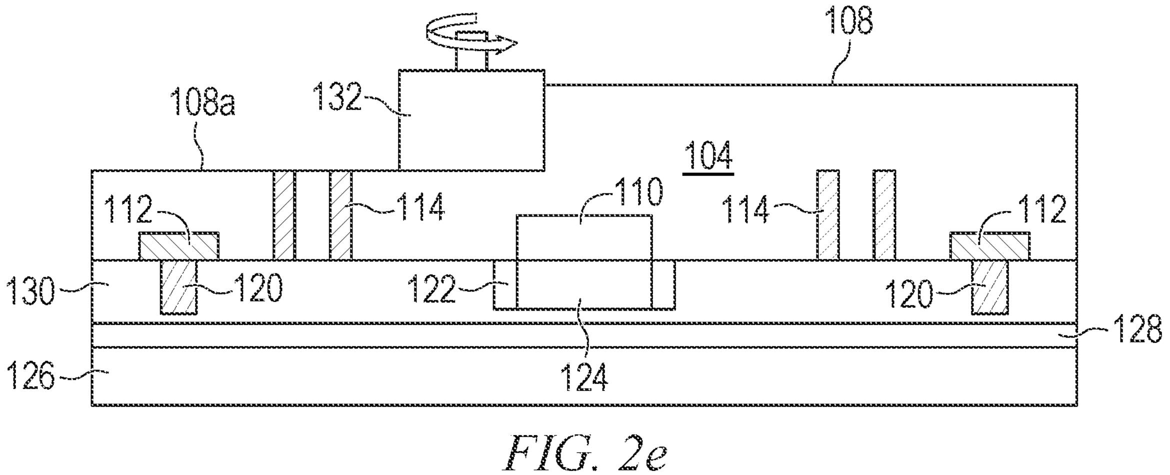

In FIG. 2*e*, wafer 100 is flipped so that back surface 108 is available for backgrinding with grinder 132. Grinder 132 removes a portion of photonic bridge die 104 to reduce a thickness of wafer 100 and the die. The thickness of photonic bridge die 104 is reduced to be equal to or less than a length of conductive vias 114 so that new back surface 108*a* has the conductive vias exposed.

Figure 2F:
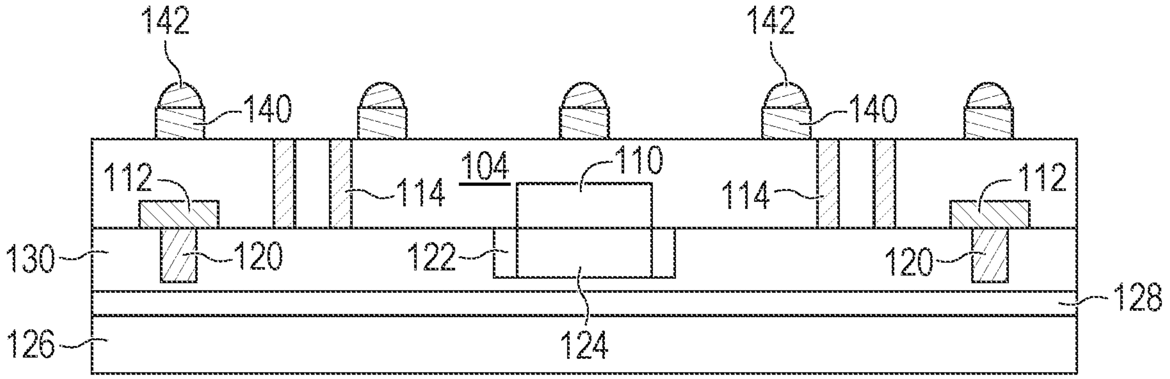

In FIG. 2*f*, after backgrinding is complete across the entire footprint of all photonic bridge die 104, interconnect structures are formed on new bottom surface 108*a* to electrically connect to conductive vias 114. The interconnect structures in FIG. 2*f* are conductive pillars, contact pads, or UBM 140 and solder bumps or caps 142. Conductive pillars 140 are formed using any suitable conductive layer formation methods and materials. Conductive pillars 140 can be formed directly on conductive vias 114 or one or more additional redistribution layers (RDL) can be formed to route electrical signals between the conductive vias and contact pads. Solder bumps 142 are formed by printing a solder paste over conductive pillars 140 and then reflowing the solder paste to form balls or bumps. In one embodiment, conductive pillars

140 and solder bumps 142 are both formed by depositing their respective material into the same mask openings on top of each other.

Figure 2G:
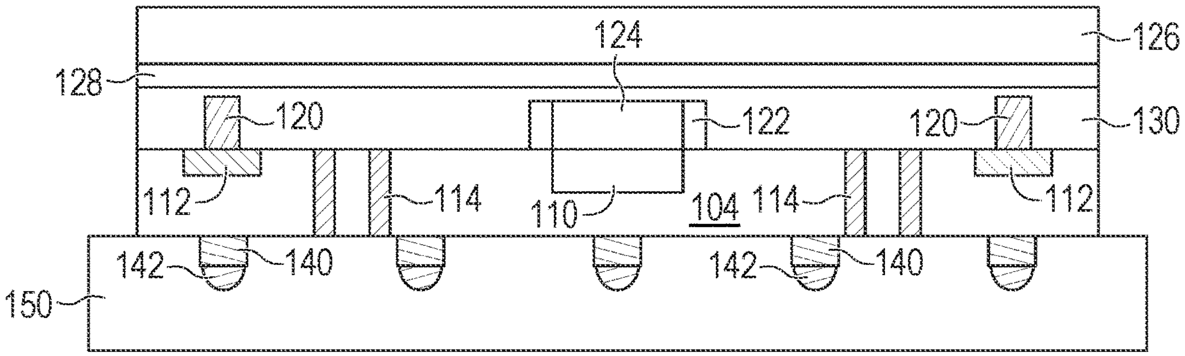
Figure 2H:
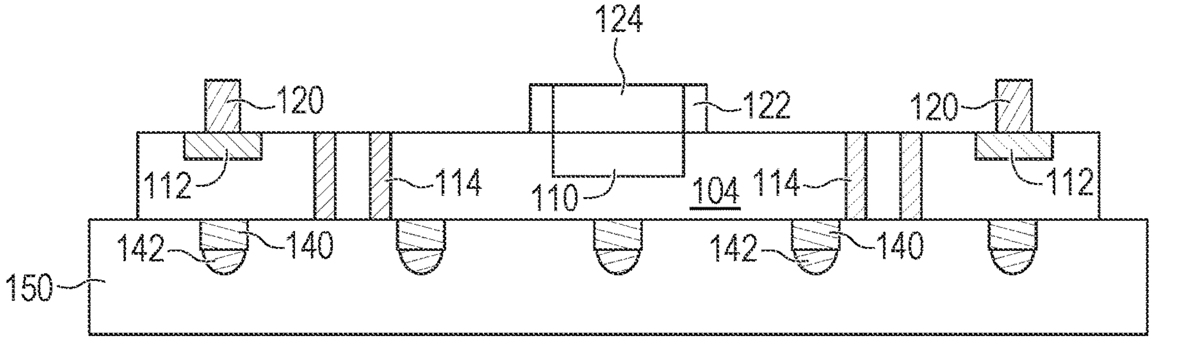
Figure 2I:
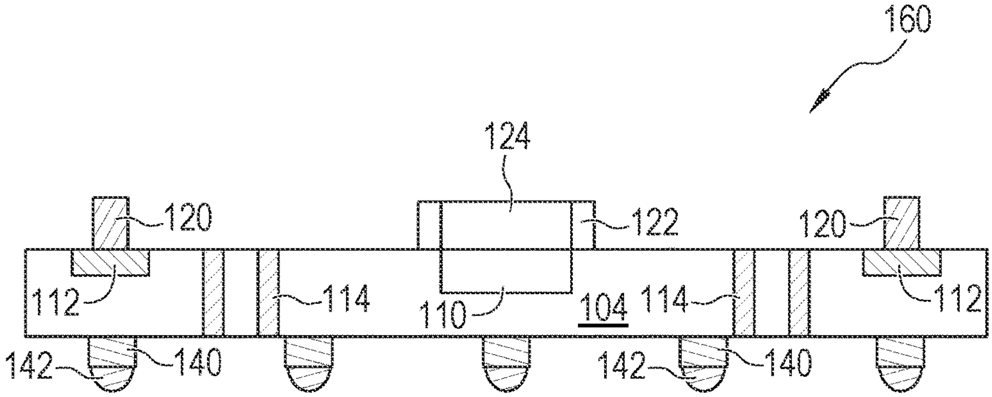

In FIG. 2*g*, wafer 100 is flipped and mounted onto dicing tape 150. Dicing tape has a thermal, UV, or other type of releasable adhesive in some embodiments. Carrier 126 is removed in FIG. 2*h* using laser, thermal, UV, or another type of release. Photonic bridge die 104 are singulated from each other and removed from dicing tape 150 to finish a processed photonic bridge die 160 in FIG. 2*i*. Photonic bridge die 160 has photonic circuit 110 protected by epoxy 124 so that further processing does not damage or cover the photonic circuit.

Figure 3A:
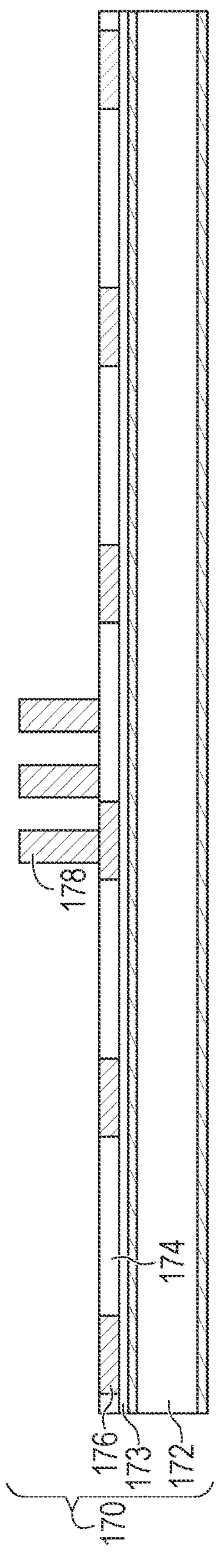
FIGS. 3*a*-3*g* illustrate forming a system-in-package module with the prepared photonic bridge die.

FIGS. 3*a*-3*g* illustrate forming a system-in-package (SiP) module 170 including photonic bridge die 160. FIG. 3*a* shows a carrier 172 used to form the SiP modules on. While only a single SiP module 170 is shown as being formed on carrier 172, tens, hundreds, or more SiP modules are typically formed together on a common carrier using the steps shown below but performed en masse before the SiP modules are singulated from each other.

Carrier 172 can be any kind of temporary substrate containing sacrificial base material such as silicon, polymer, beryllium oxide, glass, copper-clad laminate, or other suitable low-cost, rigid material for structural support. A passivation layer 173 is formed on carrier 172. An interconnect structure is formed on passivation layer 173 comprising insulating layer 174 and conductive layer 176. The interconnect structure can be any type of RDL structure and include any number of insulating layers interleaved with any number of conductive layers to implement the desired signal routing. Conductive traces can extend from the illustrated contact pads of conductive layer 176 over or under insulating layer 174 to connect the contact pads to components mounted above or below.

Insulating layer 174 contains one or more layers of silicon dioxide (SiO2), silicon nitride (Si3N4), silicon oxynitride (SiON), tantalum pentoxide (Ta2O5), aluminum oxide (Al2O3), solder resist, polyimide (PI), benzocyclobutene (BCB), polybenzoxazoles (PBO), and other material having similar insulating and structural properties. Insulating layer 174 can be formed using PVD, CVD, printing, lamination, spin coating, spray coating, sintering, thermal oxidation, or another suitable process. Any insulating, passivation, or dielectric layer disclosed above or below can be formed using the same methods and materials. Conductive layer 176 is formed as described above for other conductive layers. Conductive pillars 178 are formed on contact pads connected to conductive layer 176 as described above for other conductive layers, pillars, or micropillars. Conductive pillars 178 are formed by depositing conductive material into mask openings in some embodiments.

Figure 3B:
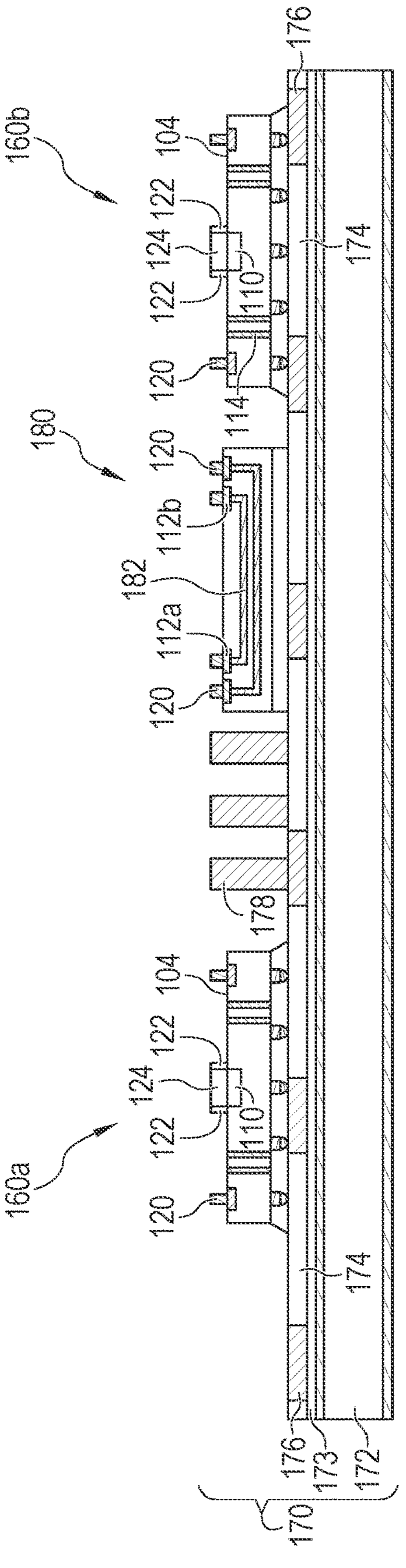

In FIG. 3*b*, a pair of photonic bridge die 160 are mounted onto carrier 172. Photonic bridge die 160 are mounted with solder bumps 142 on contact pads connected to conductive layer 176. Micropillars 120 extend upward away from substrate 172 for subsequent electrical interconnect. Photonic circuit 110 remains protected by epoxy 124. An underfill is used between photonic bridge die 160 and carrier 172 in some embodiments. Only one, or more than two, photonic bridge die 160 are used in other embodiments.

Additional non-photonic bridge die 180 can be used as well in cases where additional bridge die are needed but no additional photonic functionality is necessary. Bridge die 180 has a fine-pitched interconnect structure 182 formed in RDL on the bridge die, as described above for photonic bridge die 160, but has no photonic circuit 110. Bridge die 180 has contact pads 112 and micropillars 120 as with photonic bridge die 160. Bridge die 180 has no conductive vias 114, and therefore is simply mounted onto insulating layer 174 with an adhesive layer. In other embodiments, bridge die 180 has conductive vias 114, micropillars 140, and solder bumps 142. Likewise, photonic bridge die 104 can be formed with or without conductive vias 114.

Figure 3C:
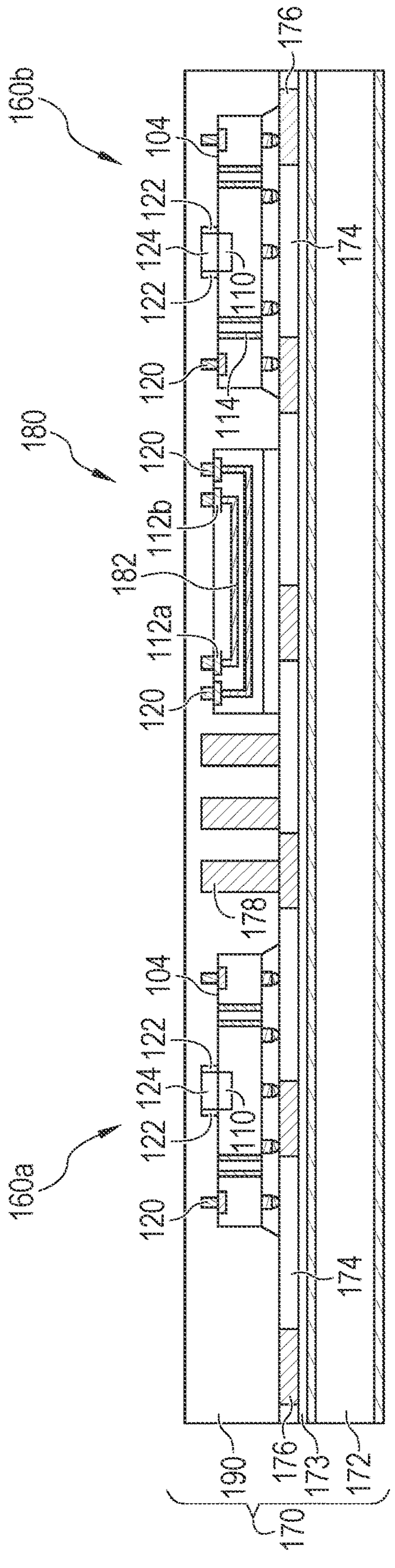

In FIG. 3*c*, encapsulant or molding compound 190 is deposited over and around carrier 172, bridge die 160 and 180, and conductive pillars 178 using a paste printing, compressive molding, transfer molding, liquid encapsulant molding, vacuum lamination, spin coating, or another suitable applicator. Encapsulant 190 can be liquid or granular polymer composite material, such as epoxy resin, epoxy acrylate, or polymer, with or without an added filler. In another embodiment, encapsulant 190 is a laminated mold sheet or film with or without fillers. Encapsulant 190 is non-conductive, provides structural support, and environmentally protects bridge die 160 and 180 from external elements and contaminants. Encapsulant 190 completely covers the top and side surfaces of micropillars 120, dam 122, and epoxy 124. In another embodiment, encapsulant 124 is deposited to have a top surface coplanar to the top surfaces of micropillars 120 and epoxy 124, e.g., by using film-assisted molding.

Figure 3D:
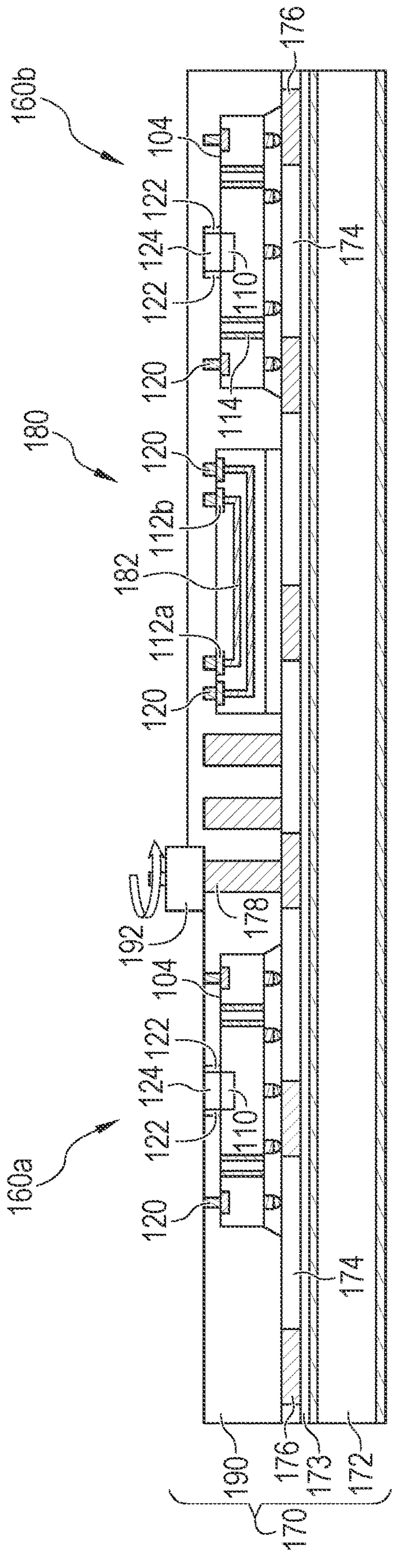

In FIG. 3*d*, a grinder 192 is used to remove a portion of encapsulant 190 and thereby expose top surfaces of micropillars 120, epoxy 124, and conductive pillars 178. Chemical-mechanical planarization or another suitable method is used in other embodiments. In some embodiments, portions of micropillars 120 and epoxy 124 are removed to ensure that all desired elements are exposed and coplanar. After exposing epoxy 124, the epoxy can be polished, have additional coatings added, or otherwise be processed to improve optical properties. Epoxy 124 can be shaped to create a lens effect prior to curing, after exposing with grinder 192, or at any other suitable manufacturing step.

Figure 3E:
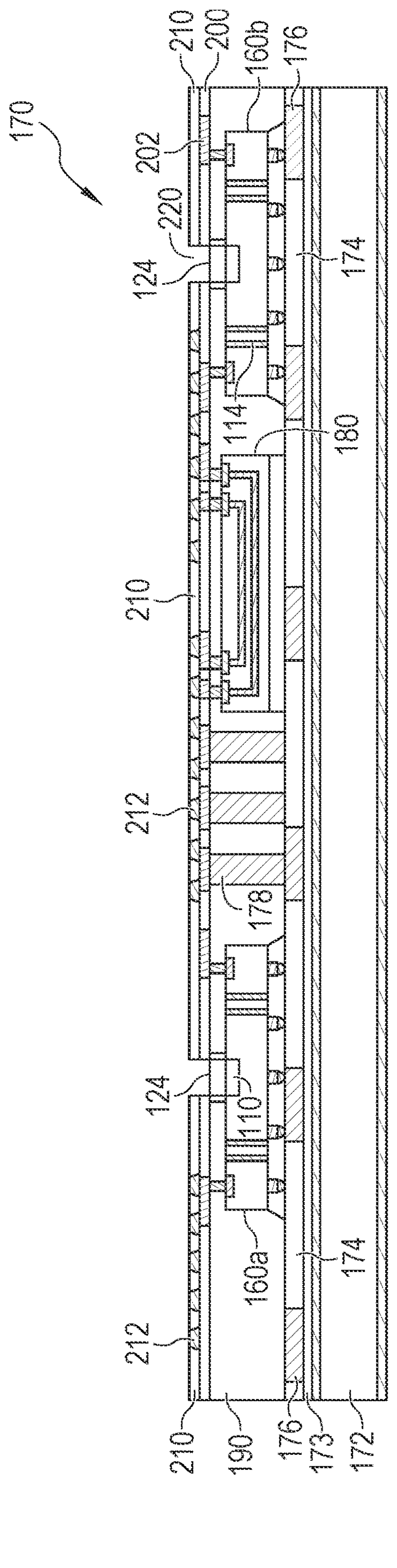

In FIG. 3*e*, an additional interconnect structure comprising insulating layer 200, conductive layer 202, insulating layer 210, and conductive layer 212 is formed over encapsulant 190. Any desired number of insulating and conductive layers can be interleaved over each other to implement the desired signal routing. Conductive layer 202 includes contact pads and conductive traces to route signals from micropillars 120 to the overlying portions of conductive layer 212. Conductive layer 212 includes contact pads or UBM for mounting semiconductor die. Any suitable type of RDL or build-up interconnect structure can be formed on encapsulant 190. Openings 220 are formed through insulating layers 200 and 210 to keep photonic circuits 110 exposed to incoming stimulus through epoxy 124.

Figure 3F:
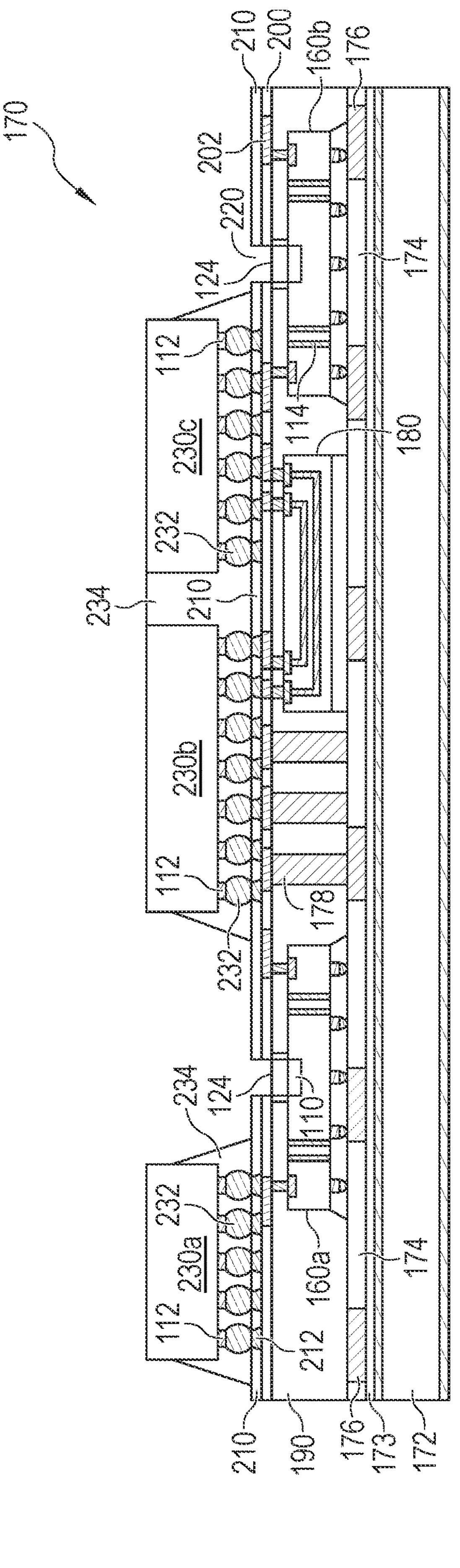

FIG. 3*f* shows three main die 230*a*, 230*b*, and 230*c* mounted onto contact pads of conductive layer 212 with solder bumps 232. Other connection methods are used in other embodiments. An underfill 234 is dispensed between insulating layer 210 and main die 230. Underfill 234 can extend up side surfaces of main die 230 and is made coplanar to the back surfaces of the main die in some embodiments. Main die 230 can be any type of die that serve the main function of the package being formed, e.g., ASICs, microprocessors, central processing units (CPU), graphical processing units (GPU), accelerators, logic die, high-bandwidth memory (HBM), I/O die, or NAND flash. Main die 230 can be identical to each other or different, e.g., a CPU, a GPU, and memory. Additional bridge die may be placed on top of insulating layer 210 if convenient for package layout. Any other suitable components, e.g., other semiconductor die or discrete active or passive electrical components, can be mounted along with main die 230.

Main die 230*a* and 23*b* are disposed over or adjacent to opposing sides of photonic bridge die 160*a*. Main die 230*a* and 230*b* are each electrically coupled to photonic bridge die 160*a* by conductive layers 202 and 212. Photonic bridge die 160*a* electrically couples main die 230*a* and 230*b* together with a higher bandwidth that would be possible through conductive layers 202 and 212 alone. Likewise, bridge die 180 couples main die 230*b* and 230*c* together, and photonic bridge die 160*b* couples main die 230*c* to another main die not shown in the illustrated cross-section. More than two die are coupled together by one bridge die in other embodiments.

Bridge die 160 and 180 provide faster and higher density interconnect than what is available through conductive layers 202 and 212. Only a small portion of the interconnect distance between main die 230 occurs in interconnect structure 160, while most of the interconnect distance is through the bridge die. Components are not to scale, and the proportion of distance covered by bridge die in practice will be greater than illustrated. In some embodiments, main die 230 have some signals with lower bandwidth requirements that are coupled directly to each other through conductive layers 202 and 212. For instance, high bandwidth data lines between the two main die may utilize bridge die 160 while slower control signals are connected directly without the bridge die.

Figure 3G:
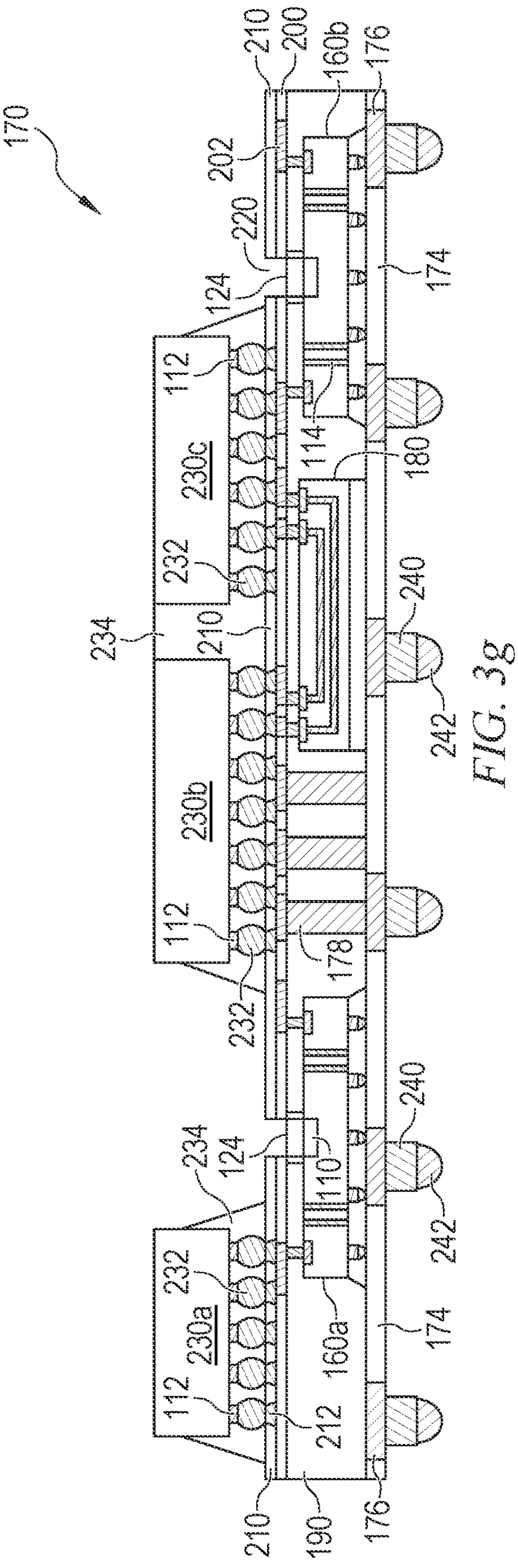

In FIG. 3*g*, carrier 172 is removed using thermal release or another suitable method. Conductive pillars 240 and solder bumps or caps 242 are formed on the newly exposed surfaces of conductive layer 176. Conductive pillars 240 and solder bumps 242 are formed as described above for conductive pillars 140 and solder bumps 142, but on a larger scale. Solder bumps 242 are electrically coupled to main die 230 through conductive layer 176, conductive pillars 178, conductive vias 114, contact pads 112, micropillars 120, conductive layer 202, conductive layer 212, and solder bumps 232.

SiP module 170 is a semiconductor package with multiple main die 230 electrically interconnected through bridge die 160 and 180. Bridge die 160 have photonic circuits 110 exposed in the final package to allow light or another stimulus to be detected. Photonic bridge die 160 are embedded within the package substrate, and were protected during manufacturing of the package by epoxy 124. Epoxy 124 allows encapsulant 190 to be removed over photonic circuit 110 without any physical contact with the photonic circuit during the removal process.

Figure 4A:
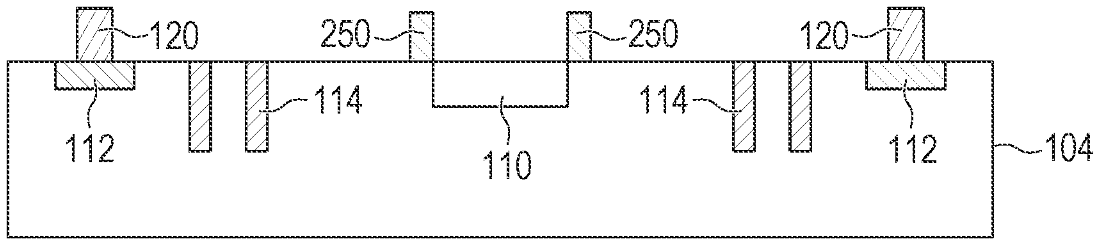
FIGS. 4*a*-4*e* illustrate the preparation process using conductive pillars as an epoxy dam.

FIGS. 4*a*-4*e* illustrate another embodiment for protecting photonic circuit 110 during manufacturing of SiP module 170. In FIG. 4*a*, a plurality of micropillars 250 is formed on photonic bridge die 104 surrounding photonic circuit 110 in plan view. Micropillars 250 can be formed in substantially the same way and concurrently with micropillars 120. A conductive layer formed on photonic bridge die 104 optionally has contact pads to provide a base for micropillars 250.

Figure 4B:
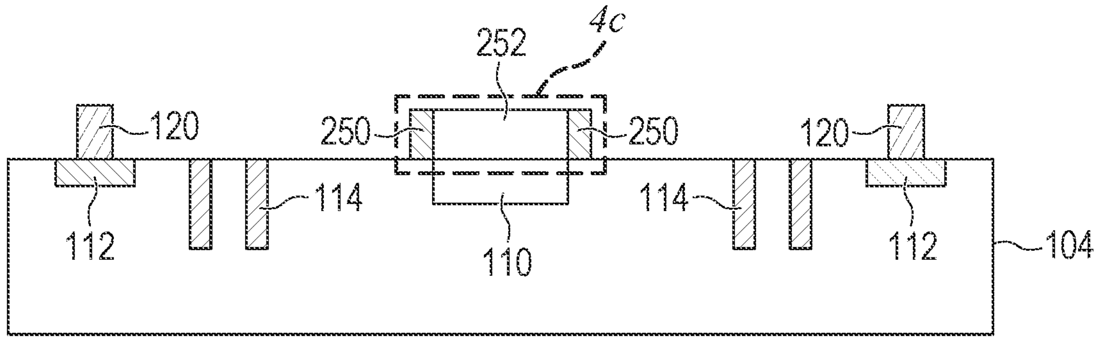
Figure 4C:
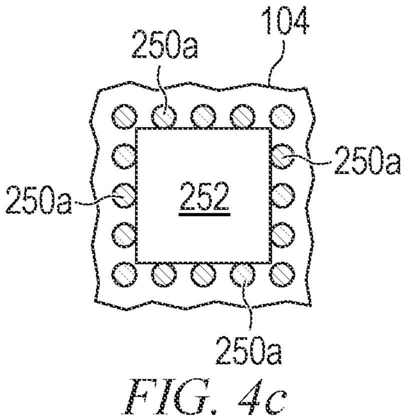
Figure 4D:
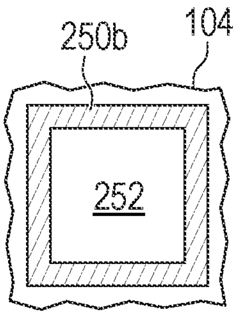

In FIG. 4*b*, epoxy 252 is deposited into the space between micropillars 250. Epoxy 252 is substantially the same as epoxy 122 above, e.g., a translucent or transmissive epoxy to allow a stimulus to be transmitted through the epoxy and be detected by photonic circuit 110. Micropillars 250 can be a plurality of discrete pillars lined up around photonic circuit 110, as shown in the plan view of FIG. 4*c* with micropillars 250*a*. Micropillars 250*a* are formed as a plurality of discrete elements but formed close enough to each other that epoxy 252 being applied as a fluid does not flow through the micropillars, or only slightly flows in between the pillars but not significantly outside the footprint of photonics circuit 110. Alternatively, micropillar 250 can be formed as a single continuous pillar around photonic circuit 110 as shown with micropillar 250*b* in FIG. 4*d*. Epoxy 252 is then cured.

Figure 4E:
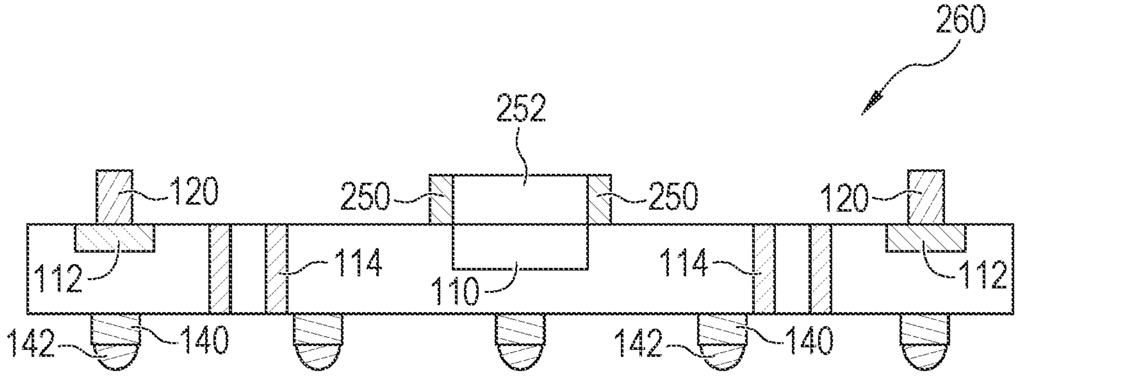

Other than the use of micropillars 250 instead of dam 122, preparation is largely the same as described above. FIG. 4*e* shows pillars 140 and solder bumps 142 formed over the back surface of photonic bridge die 104 after backgrinding to finish a prepared photonic bridge die 260. Photonic bridge die 260 is singulated and included in package 170 as described above for photonic bridge die 160.

Figure 5A:
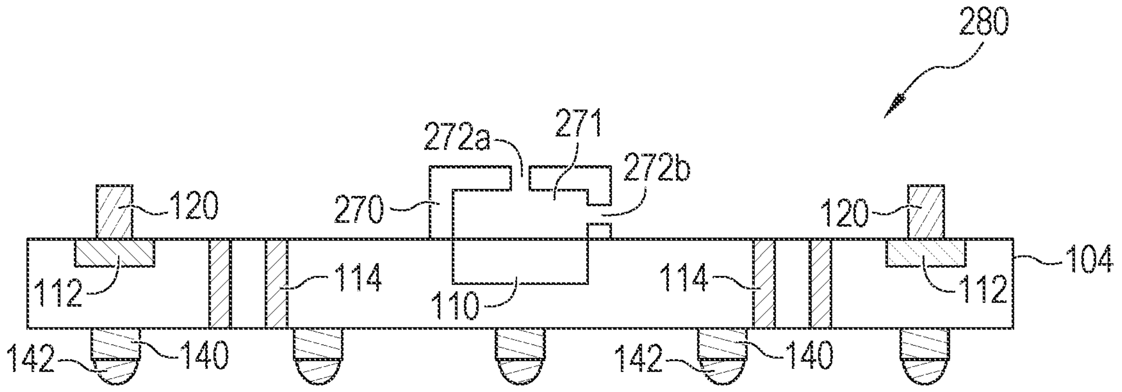
FIGS. 5*a*-5*e* illustrate a lid used to protect the photonic circuit during the embedding process.

FIGS. 5*a*-5*e* illustrate a third embodiment for protecting photonic circuit 110 while manufacturing SiP module 170. FIG. 5*a* shows a lid 270 disposed on photonic bridge die 104 over photonic circuit 110 to form a prepared photonic bridge die 280. Lid 270 can be placed using a pick-and-place machine or other suitable means. Lid 270 includes a cavity 271 such that the lid does not physically contact photonic circuit 110. Lid 270 has a first degas hole 272*a* formed in the top of the lid and a second degas hole 272*b* formed in a sidewall of the lid. In other embodiments, a single hole in either the top or side of the lid is sufficient. Degas holes 272 allow air pressure within cavity 271 to equalize with the ambient air pressure after mounting, e.g., as the air temperature in the cavity cools after soldering lid 270 onto contact pads of photonic bridge die 104.

Lid 270 can be formed of any suitable rigid material, e.g., a polymer or a metal such as copper, aluminum, or steel. Lid 270 can be formed by molding, by folding a sheet of material, by etching cavity 271 into a sheet of material, or by any other suitable means. In one embodiment, lid 270 is a pre-molded out of an epoxy-molding compound. Lid 270 is attached to photonic bridge die 104 with an adhesive or solder layer. In one embodiment, an epoxy is used to attach lid 270 to photonic bridge die 104 over photonic circuit 110.

Figure 5B:
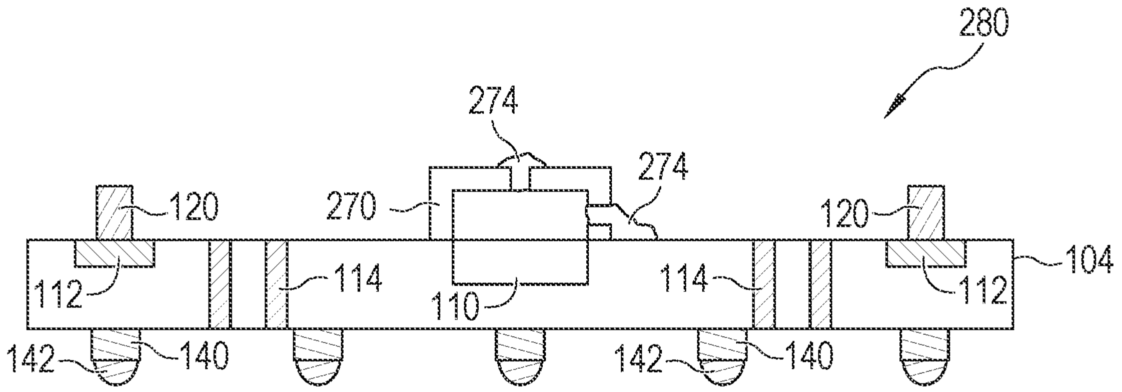
Figure 5C:
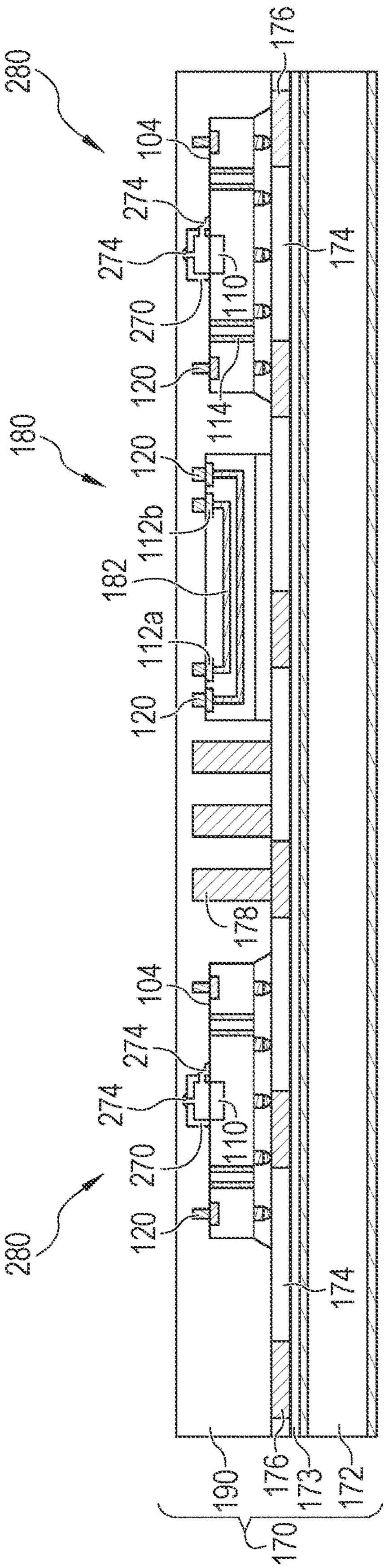
Figure 5D:
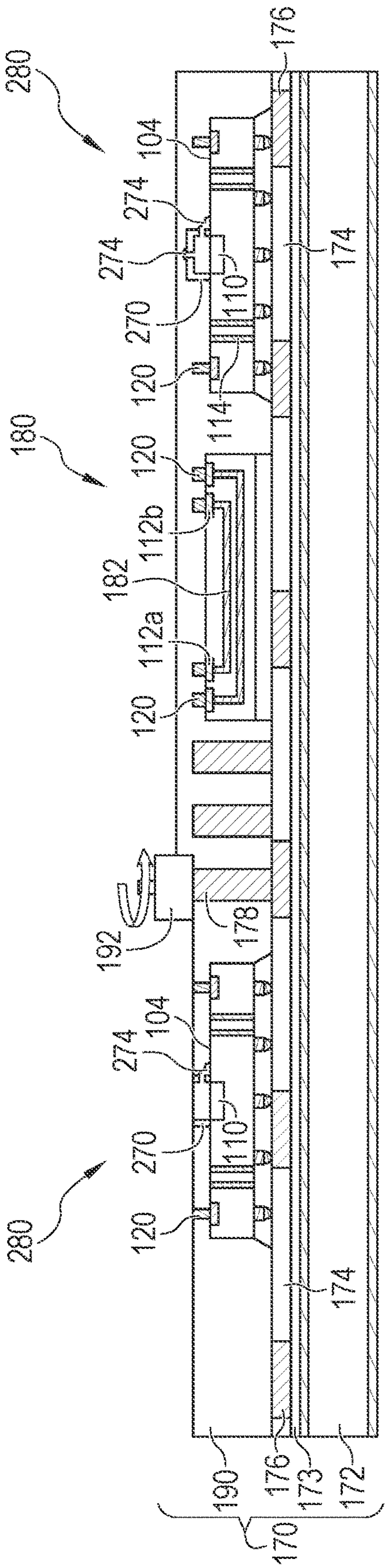
Figure 5E:
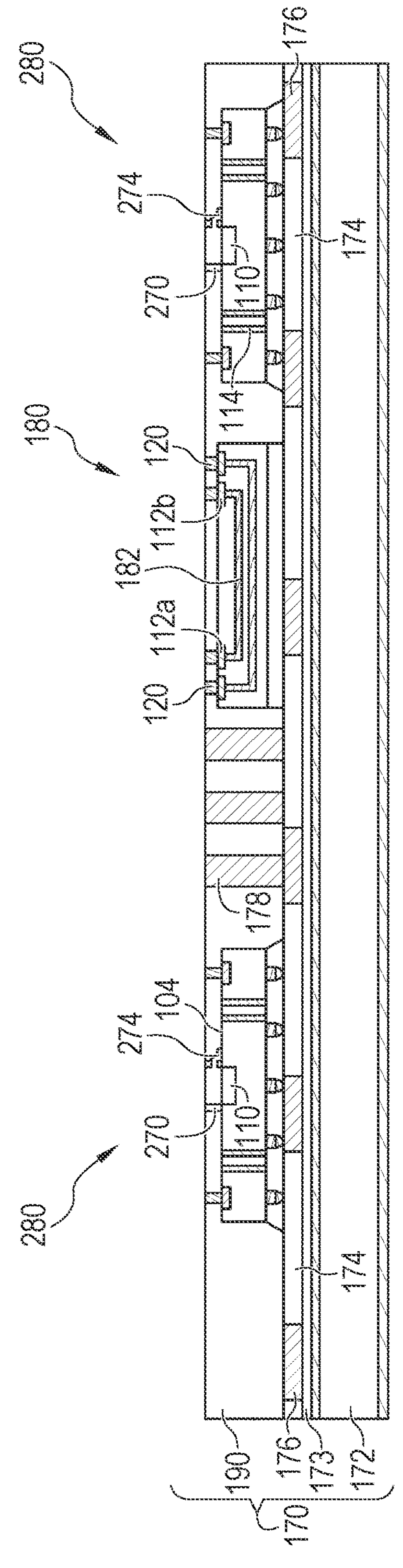

In FIG. 5*b*, an adhesive or epoxy material 274 is disposed or deposited to fill degas holes 272. Adhesive 274 is cured after deposition. The addition of adhesive 274 seals cavity 271 and completes the protection for photonic circuit 110 when encapsulant 190 is deposited in FIG. 5*c*. The combination of lid 270 and epoxy 274 in openings 272 blocks encapsulant 190 from covering photonic circuit 110. Backgrinding with grinder 192 in FIG. 5*d* removes the top of lid 270 and exposes photonic circuit 110 through cavity 271. FIG. 5*e* shows backgrinding completed. The top of lid 270 was removed by backgrinding, leaving just the sides of the lid remaining while photonic circuit 110 is now exposed to the outside world through cavity 271. SiP module 170 is completed as described above and illustrated in FIGS. 3*e*-3*g*, but with lid 270 having been used instead of dam 122 and epoxy 124 to protect photonic circuit 110.

Figure 6A:
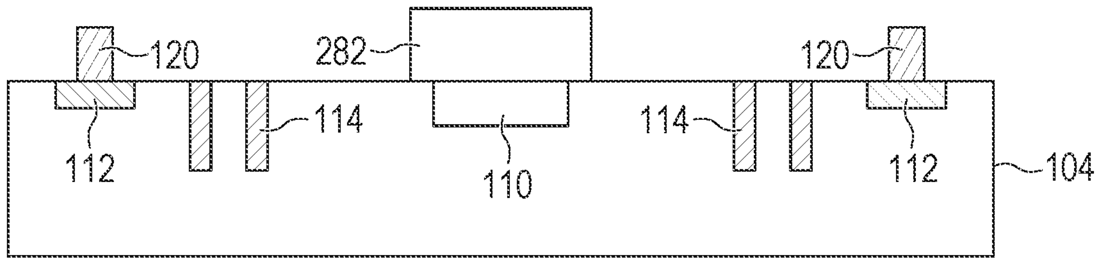
FIGS. 6*a*-6*e* illustrate a photoresist layer used to protect the photonic circuit during the embedding process.
Figure 6B:
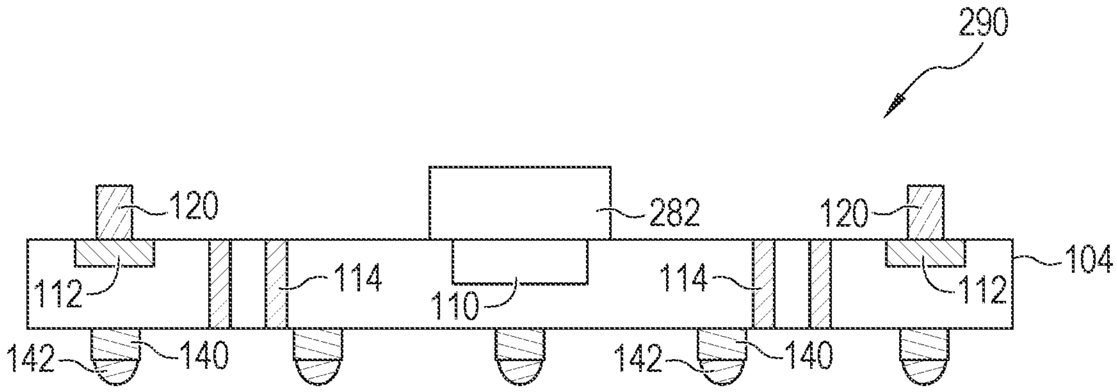
Figure 6C:
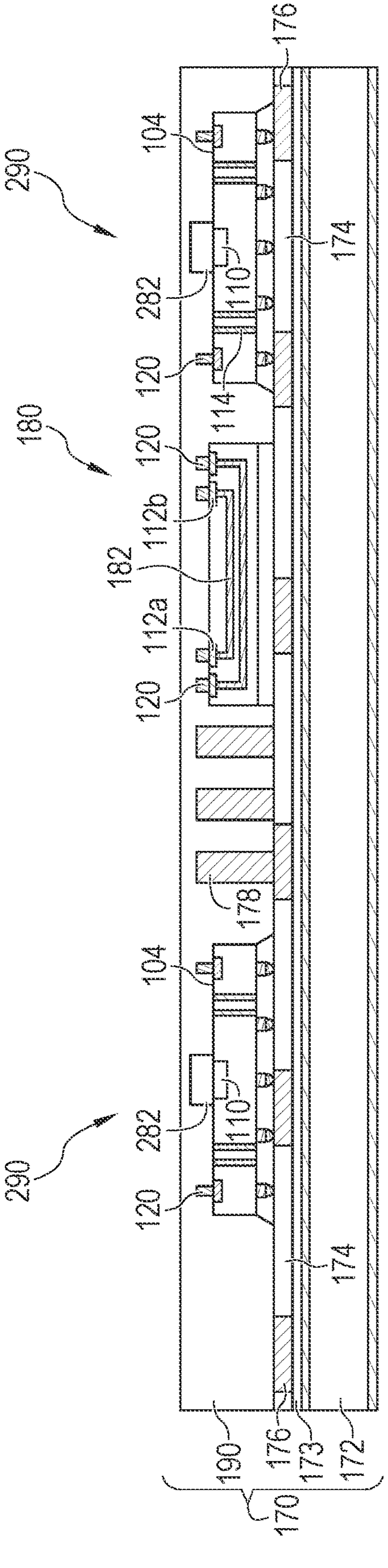
Figure 6D:
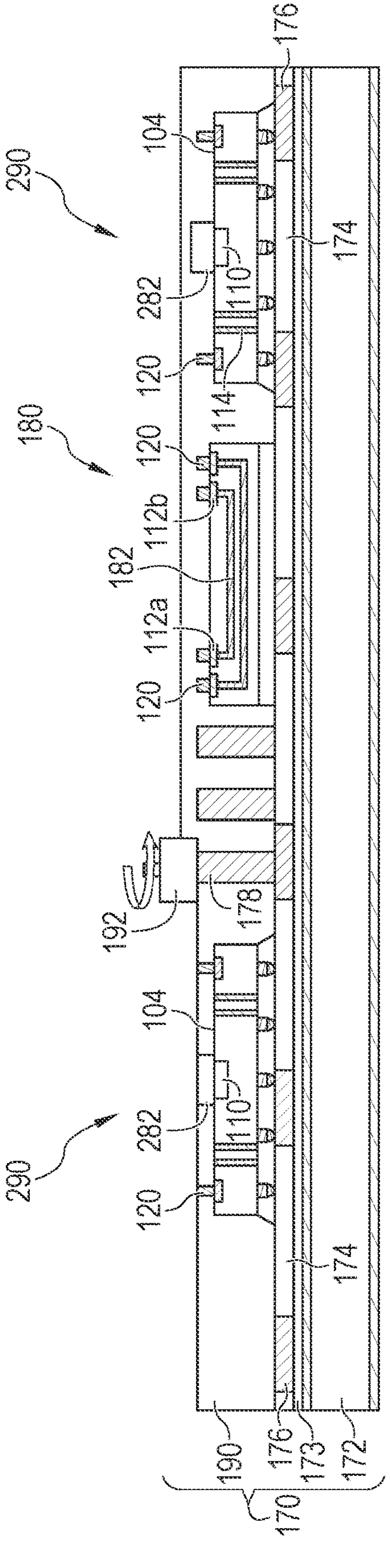

FIGS. 6*a*-6*e* illustrate a fourth embodiment for protecting photonic circuit 110. In FIG. 6*a*, a photoresist or insulating layer 282 is formed on the surface of photonic bridge die 104 over photonic circuit 110. A photoresist layer is used because the resist is easier to remove using selective chemical processes. Photoresist layer 282 is formed directly on and covering photonic circuit 110. Photoresist layer 282 can have the same or a slightly larger footprint than photonic circuit 110. FIG. 6*b* shows a completely prepared photonic bridge die 290 singulated and with pillars 140 and solder bumps 142 formed. Photoresist layer 282 blocks encapsulant 190 from being formed on photonic circuit 110 in FIG. 6*c*. In FIG. 6*d*, grinder 192 removes a portion of encapsulant 190 and exposes photoresist layer 282. Alternatively, as with all embodiments that use grinder 192, film-assisted molding or another suitable method can be used to leave photoresist layer 282 exposed from the initial encapsulation process rather than using a separate grinding process.

Figure 6E:
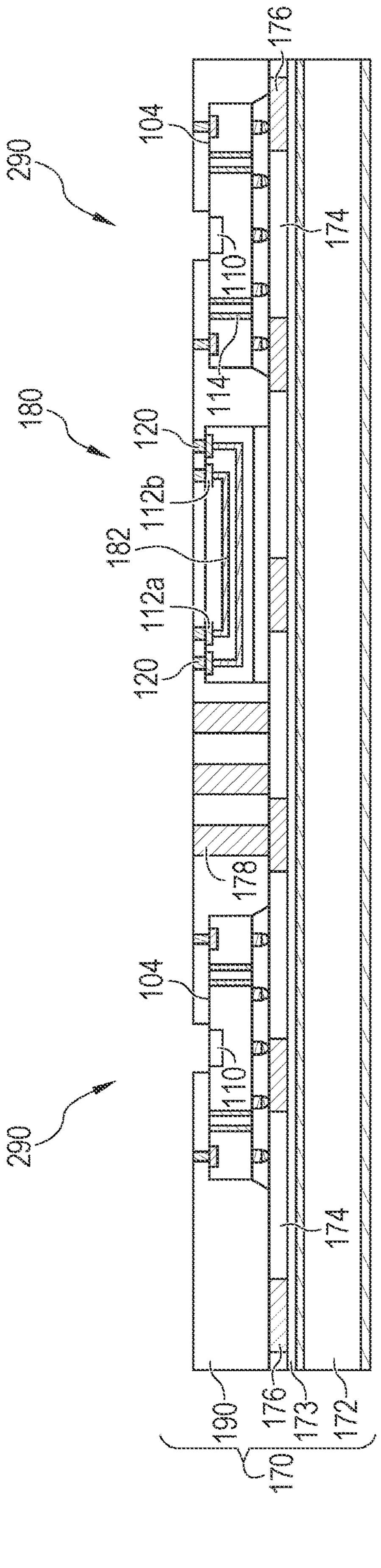

In FIG. 6*e*, photoresist layer 282 is removed using a chemical development process to expose photonic circuit 110. Photoresist layer 282 is easier to remove than if encapsulant 190 had been formed directly on photonic circuit 110. Encapsulant 190 cannot be easily selectively chemically etched as is done with photoresist layer 282 because the encapsulant is the same chemical composition over photonic circuit 110 as in other areas of SiP module 170.

Figure 7A:
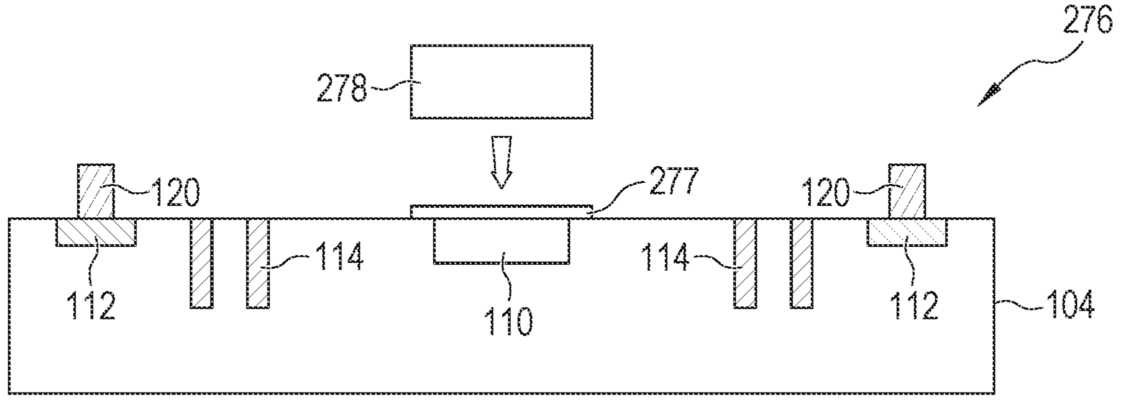
FIGS. 7*a*-7*d* illustrate a preformed optical epoxy block used to protect the photonic circuit.
Figure 7B:
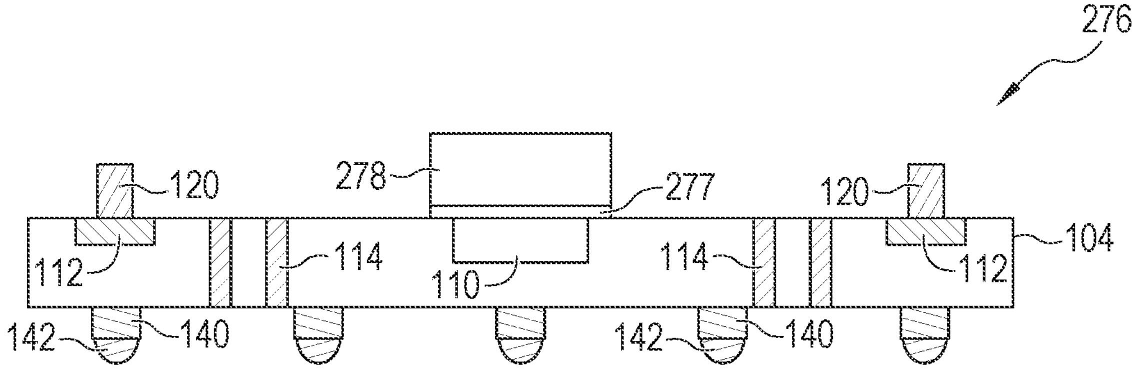

FIGS. 7*a*-7*d* illustrate an embodiment where photonic bridge die 276 has a pre-formed optical epoxy block 278 disposed on photonic circuit 110 as the protection means. FIG. 7*a* shows optical epoxy block 278 being disposed onto photonic circuit 110. Optical epoxy block 278 can be the same footprint size as, or larger than, photonic circuit 110. An optical epoxy or fiber-coupling adhesive 277 is pre-dispensed onto photonic circuit 110, optical epoxy block 278, or both, and used to attach epoxy block 278 to photonic circuit 110 in FIG. 7*b*. Adhesive 277 is cured to affix optical epoxy block 278 to photonic bridge die 104.

Figure 7C:
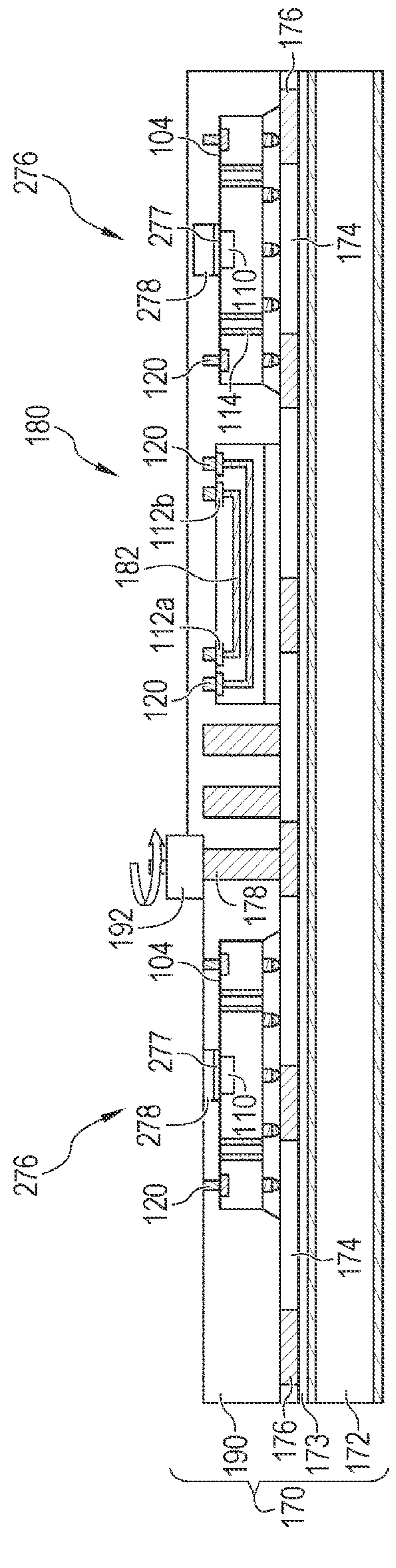
Figure 7D:
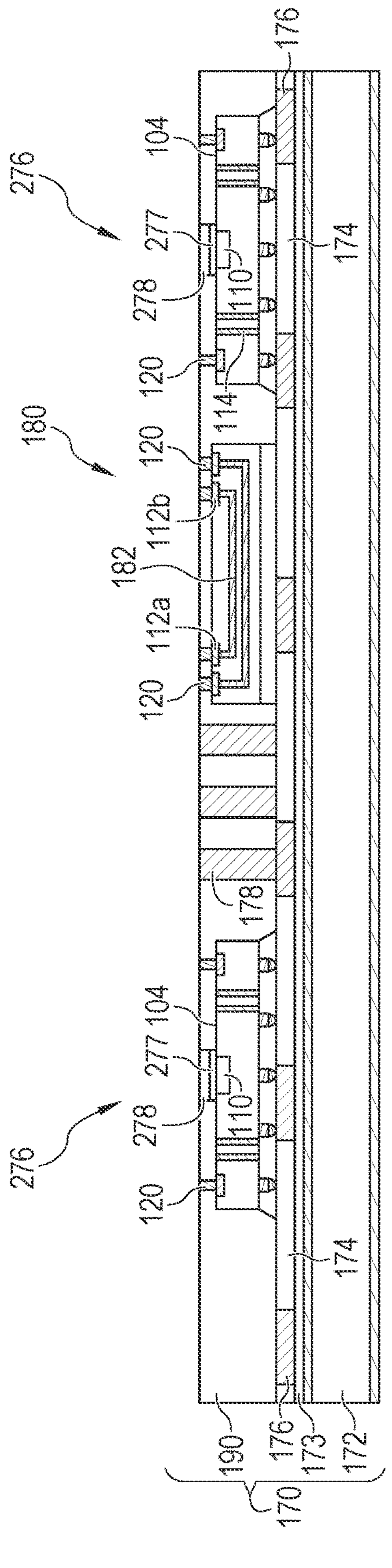

After encapsulant 190 is deposited over the SiP module 170 being manufactured, backgrinding exposes optical epoxy block 278 in FIG. 7*c*. Optical epoxy block 278 acts as a lens or cover for photonic circuit 110 after backgrinding is completed in FIG. 7*d*. SiP module 170 is completed as described above and illustrated in FIGS. 3*e*-3*g*, but with optical epoxy block 278 having been used instead of dam 122 and epoxy 124 to protect photonic circuit 110.

Figure 8A:
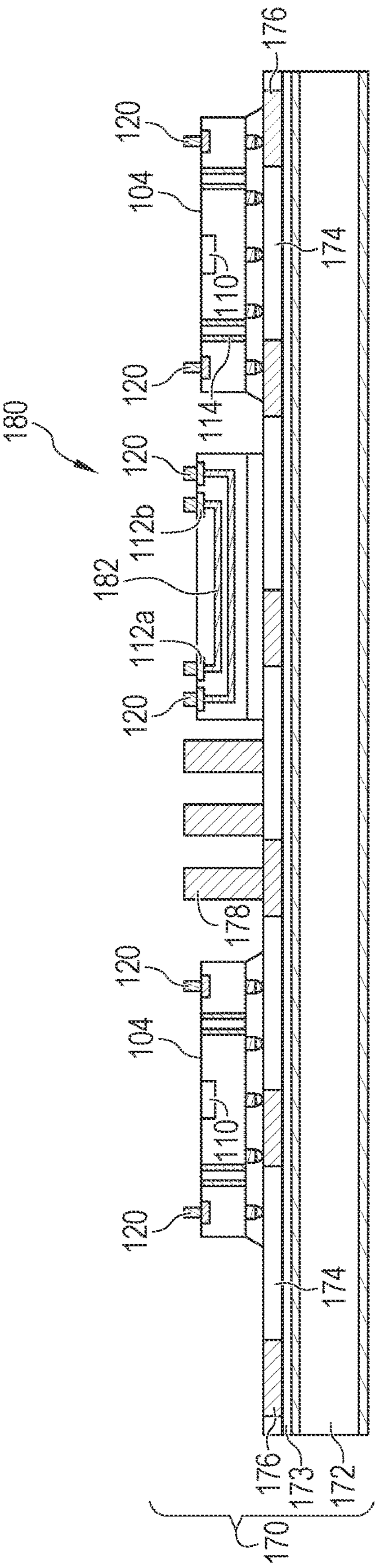
FIGS. 8*a*-8*c* illustrate a mold with protrusions to block encapsulant from covering the photonic circuit.
Figure 8B:
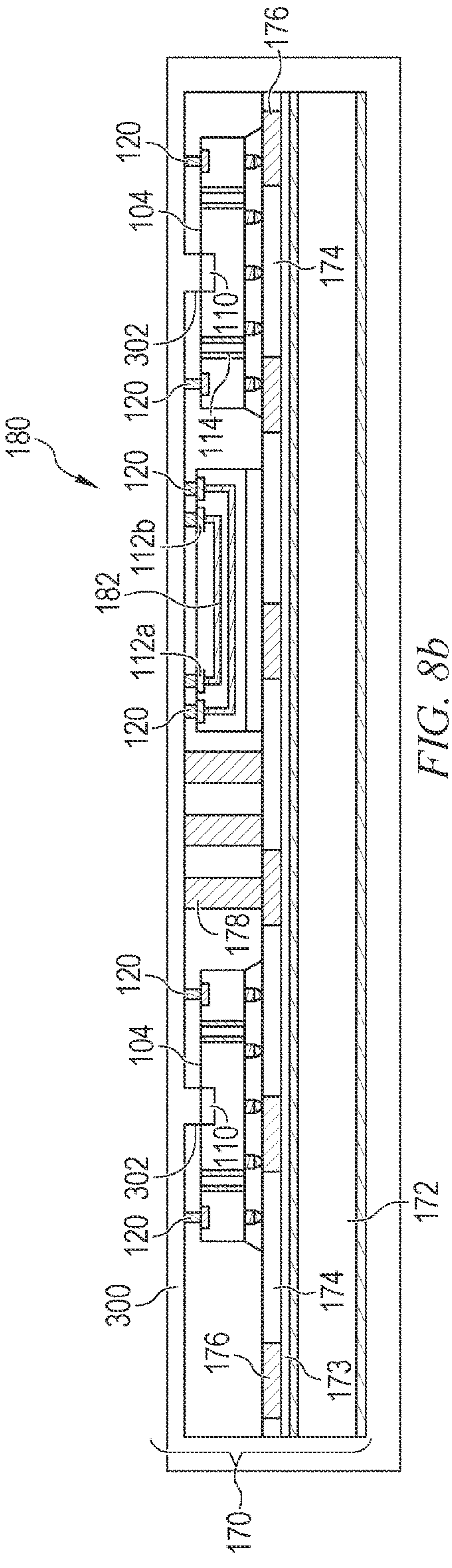
Figure 8C:
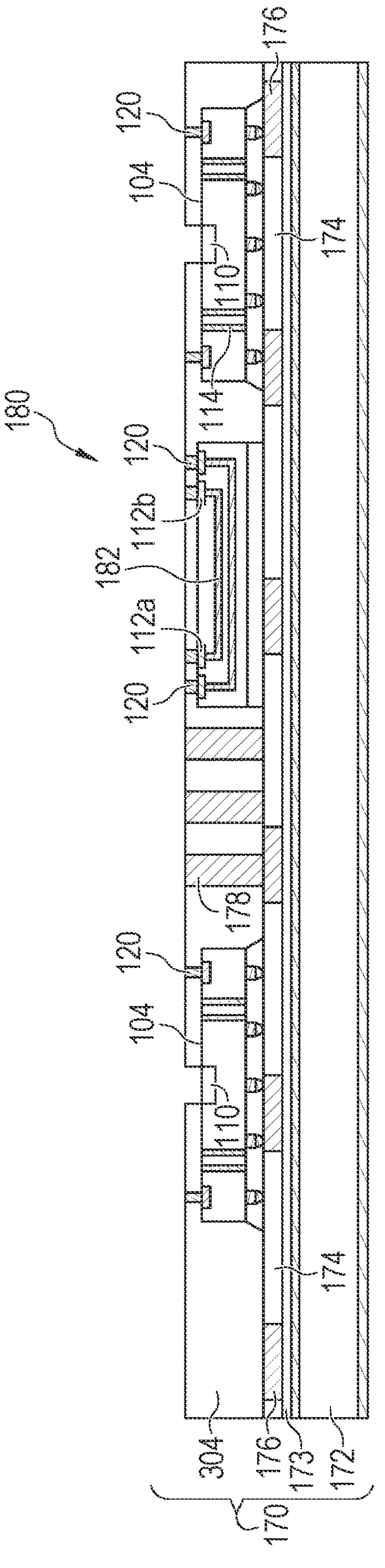

FIGS. 8*a*-8*c* show a method of protecting photonic circuit 110 using a mold cavity shaped to block encapsulant 190 from flowing over the photonic circuit. FIG. 8*a* shows photonic bridge die 104 disposed over carrier 172. Photonic bridge die 104 in FIG. 8*a* are prepared as shown in FIGS. 2*d*-21, skipping the steps where any sort of protective structure is formed on the bridge die over photonic circuit 110, e.g., as shown in FIGS. 2*b* and 2*c*.

In FIG. 8*b*, the SiP module 170 being formed, or a panel of SiP modules being formed on a common carrier, is disposed within a mold 300 with protrusions 302 that extend down and contact photonic circuit 110. Encapsulant 190 is applied by film-assisted transfer molding with protrusions 302 to make the tops of pillars 178 and micropillars 120 exposed from the encapsulant without further backgrinding or processing, as shown in FIG. 8*c*. Photonic circuit 110 is exposed from encapsulant 190 after being removed from mold 300 because protrusions 302 blocked encapsulant 190. Epoxy 124, epoxy 252, lid 270, photoresist 282, and protrusion 302 can all be considered covers disposed on or over photonic circuit 110. Manufacturing of SiP module 170 continues as described above.

Figure 9A:
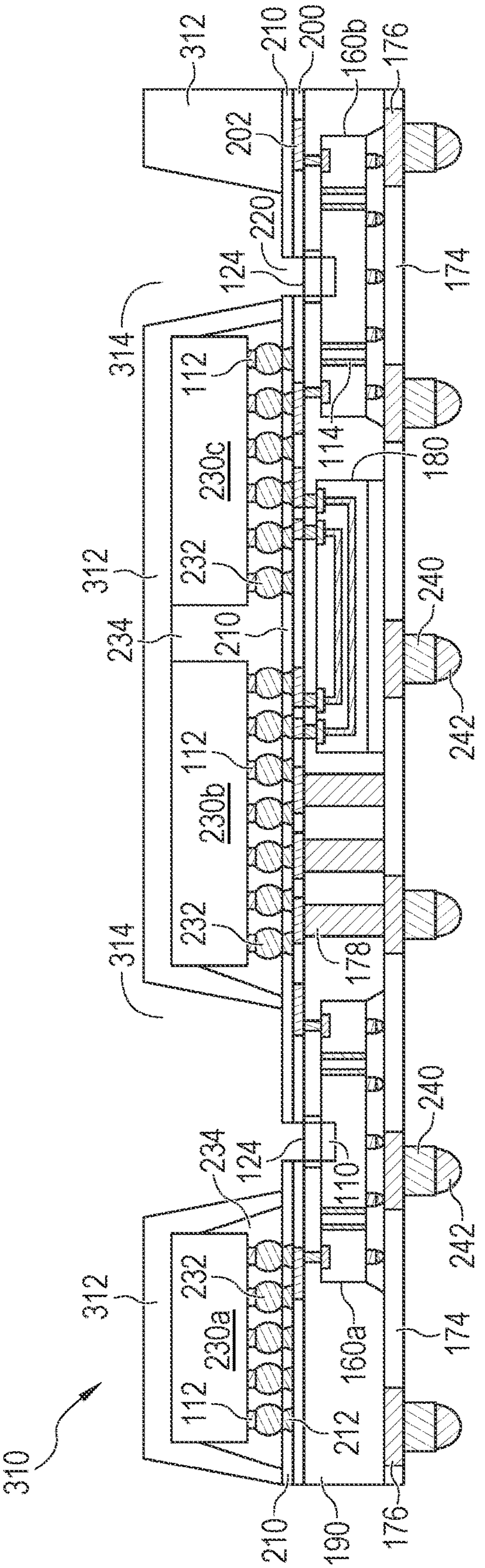
FIGS. 9*a* and 9*b* illustrate additional optional features of the system-in-package module.
Figure 9B:
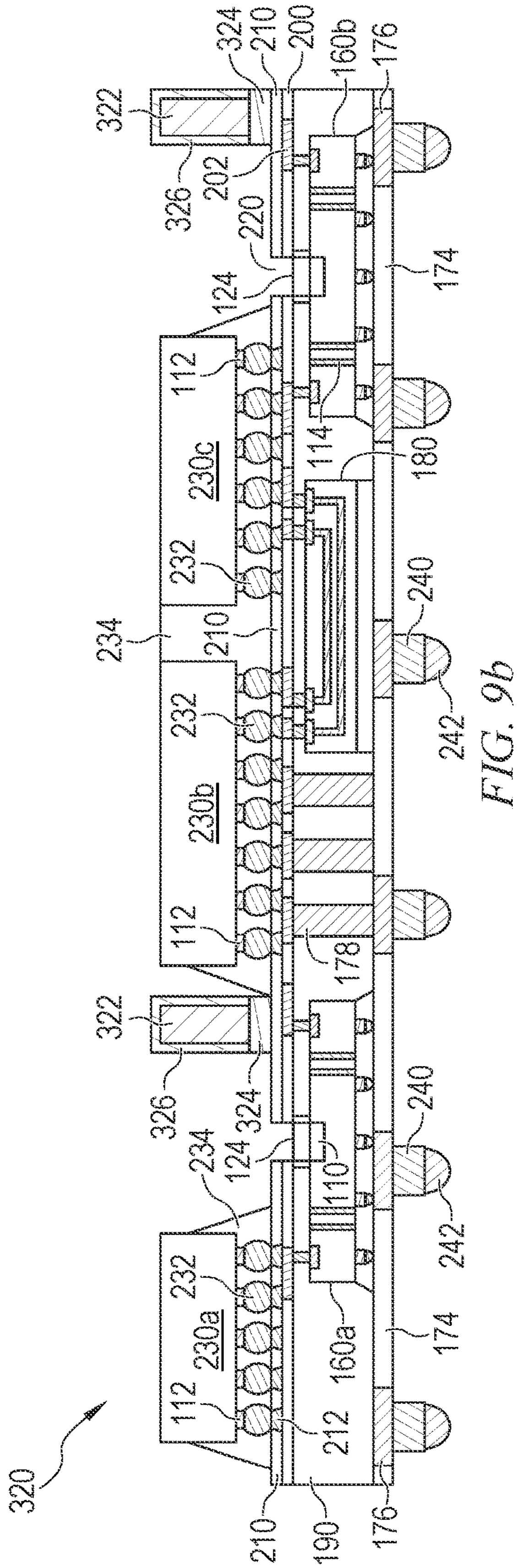

FIGS. 9*a* and 9*b* illustrate additional optional features that can be applied to any of the above embodiments. In FIG. 9*a*, an additional encapsulant 312 is deposited over SiP module 310 to provide additional protection. Openings 314 are formed through encapsulant 312 to keep photonic circuit 110 exposed to the outside world. Openings 314 can be formed using etching, drilling, film-assisted molding, masking, or other suitable methods. Encapsulant 312 is deposited using any of the methods and materials discussed above for encapsulant 190.

FIG. 9*b* shows a SiP module 320 with a stiffener 322 added. Stiffener 322 is a metal material, such as copper, iron, or aluminum, formed by etching a sheet of material, molding the material, sputtering the material into a mask, or another suitable means. In other embodiments, stiffener 322 is a polymer or other suitable material. Stiffener 322 provides physical stability and resistance to warpage to SiP module 320. Stiffener 322 is attached to insulating layer 210 by an adhesive layer 324. In other embodiments, adhesive layer 324 is a solder reflowed between stiffener 322 and conductive layer 212. Stiffener 322 includes an additional conductive or insulating coating 326 in some embodiments. Coating 326 can provide resistance to corrosion or physical damage for stiffener 322.

Figure 10A:
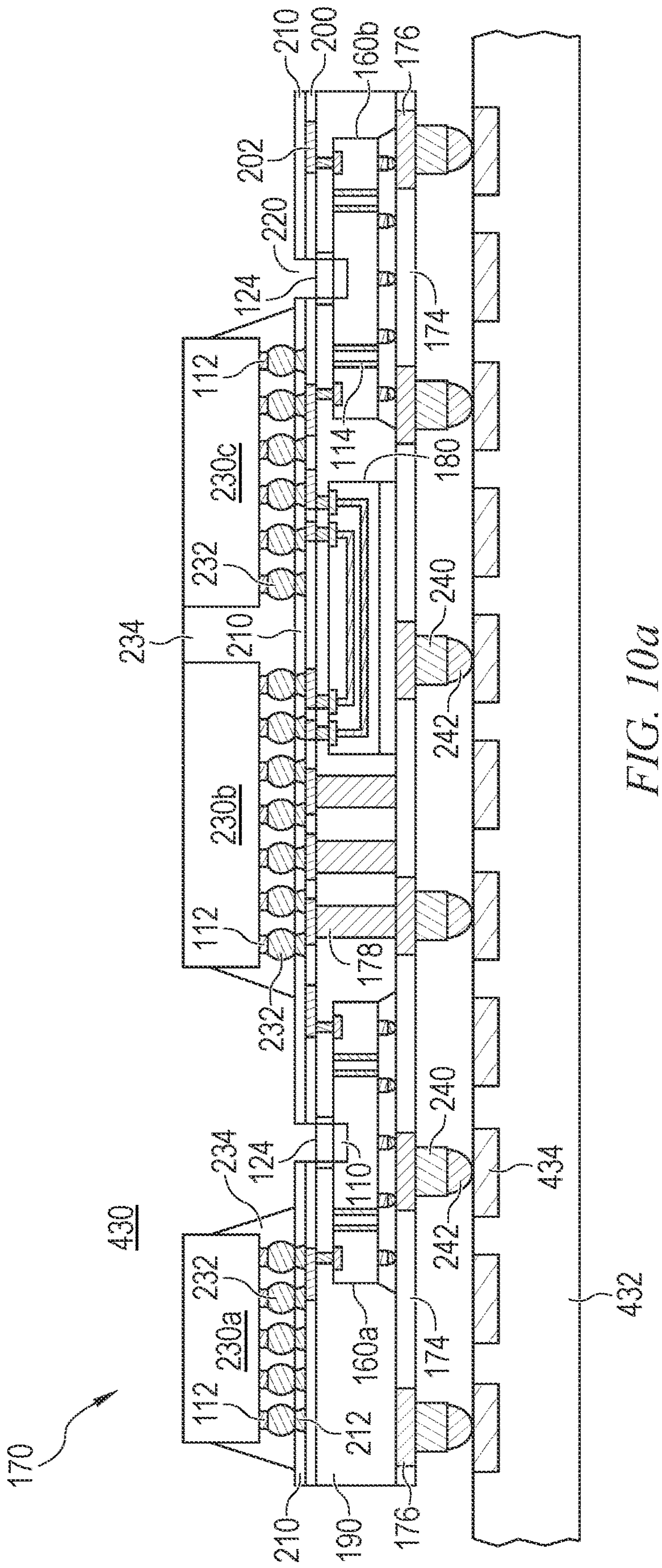
FIGS. 10*a* and 10*b* illustrate an electronic device with the system-in-package modules.
Figure 10B:
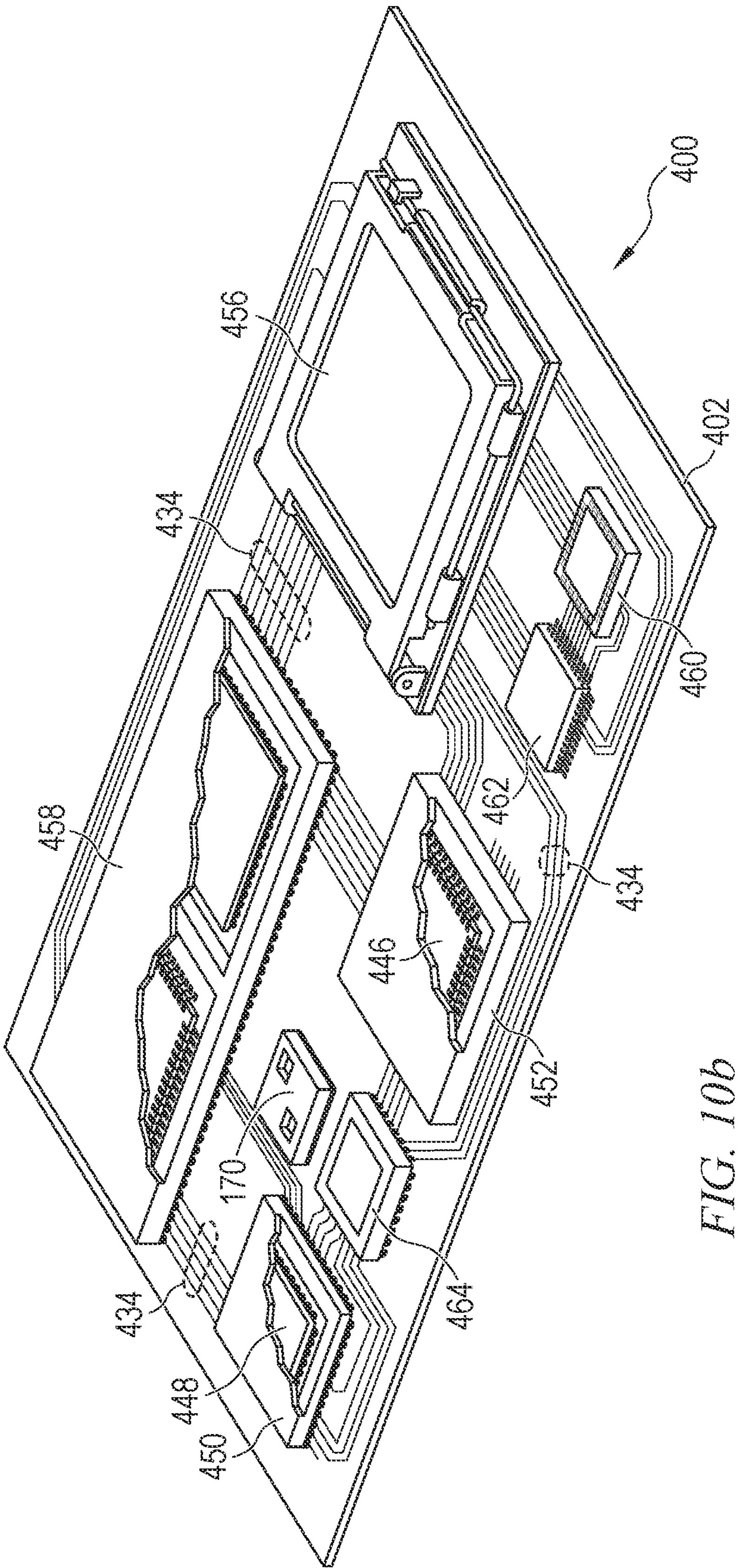

FIGS. 10*a* and 10*b* illustrate integrating the above-described semiconductor packages, e.g., SiP module 170, into a larger electronic device 430. FIG. 10*a* illustrates a partial cross-section of SiP module 170 mounted onto a printed circuit board (PCB) or other substrate 432 as part of electronic device 430. Solder bumps 242 are reflowed onto conductive layer 434 of PCB 432 to physically attach and electrically connect SiP module 170 to the PCB. In other embodiments, thermocompression or another suitable attachment and connection methods are used. In some embodiments, an adhesive or underfill layer is used between SiP module 170 and PCB 432. Semiconductor die 230 are electrically coupled to conductive layer 434 through bumps 242, pillars 240, conductive layer 176, conductive vias 114, conductive pillars 178, micropillars 120, conductive layer 202, conductive layer 212, and bumps 232. In some embodiments, an optical fiber is attached over one or more photonic circuits 110 using a grating coupler or other suitable means. Photonic circuit 110 is then used to send or receive an optical signal via the optical fiber. In another embodiment, one or more photonic circuits 110 are left exposed to detect ambient light incident to SiP module 170.

FIG. 10*b* illustrates electronic device 430 having a chip carrier substrate or PCB 432 with a plurality of semiconductor packages disposed on a surface of PCB 432, including SiP module 170. Electronic device 430 can have one type of semiconductor package, or multiple types of semiconductor packages, depending on the application.

Electronic device 430 can be a stand-alone system that uses the semiconductor packages to perform one or more electrical functions. Alternatively, electronic device 430 can be a subcomponent of a larger system. For example, electronic device 430 can be part of a tablet, cellular phone, digital camera, communication system, or other electronic device. Alternatively, electronic device 430 can be a graphics card, network interface card, or other signal processing card that can be inserted into a computer. The semiconductor package can include microprocessors, memories, ASICS, logic circuits, analog circuits, RF circuits, discrete devices, or other semiconductor die or electrical components. Miniaturization and weight reduction are essential for the products to be accepted by the market. The distance between semiconductor devices may be decreased to achieve higher density. PCB 432 may have a more irregular shape to fit conveniently into more ergonomic and smaller device shells.

In FIG. 10*b*, PCB 432 provides a general substrate for structural support and electrical interconnect of the semiconductor packages disposed on the PCB. Conductive signal traces 434 are formed over a surface or within layers of PCB 432 using evaporation, electrolytic plating, electroless plating, screen printing, or other suitable metal deposition process. Signal traces 434 provide for electrical communication between each of the semiconductor packages, mounted components, and other external system components. Traces 434 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically disposed directly on the PCB.

For the purpose of illustration, several types of first level packaging, including bond wire package 446 and flipchip 448, are shown on PCB 432. Additionally, several types of second level packaging, including ball grid array (BGA) 450, bump chip carrier (BCC) 452, land grid array (LGA) 456, multi-chip module (MCM) or SIP module 458, quad flat non-leaded package (QFN) 460, quad flat package 462, and embedded wafer level ball grid array (eWLB) 464 are shown disposed on PCB 432. In one embodiment, eWLB 464 is a fan-out wafer level package (Fo-WLP) or a fan-in wafer level package (Fi-WLP).

Depending upon the system requirements, any combination of semiconductor packages, configured with any combination of first and second level packaging styles, as well as other electrical components, can be connected to PCB 432. In some embodiments, electronic device 430 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims. The order of steps disclosed above can be rearranged unless a specific order has been described as necessary or recited in a claim. For instance, the various methods of protecting photonic circuit 110 can be applied after backgrinding wafer 100 and otherwise preparing the photonic die 104.

What is claimed:

1. A method of making a semiconductor device, comprising:
- providing a bridge die including a photonic circuit;
- depositing an optical epoxy over the photonic circuit;
- disposing the bridge die over a first interconnect structure;
- depositing an encapsulant over the bridge die and first interconnect structure;
- removing a portion of the encapsulant to expose the optical epoxy; and
- forming a second interconnect structure over the encapsulant with an opening in the second interconnect structure over the photonic circuit and optical epoxy.

2. The method of claim 1, further including disposing a first semiconductor die and second semiconductor die over the second interconnect structure, wherein the first semiconductor die is electrically coupled to the second semiconductor die through the bridge die.

3. The method of claim 2, further including disposing a stiffener around the first semiconductor die or second semiconductor die.

4. The method of claim 1, further including removing the portion of encapsulant by backgrinding.

5. The method of claim 1, further including backgrinding the bridge die to expose a conductive via of the bridge die.

6. The method of claim 1, further including:
- disposing a dam on the bridge die around the photonic circuit; and
- dispensing the optical epoxy into an area surrounded by the dam.

7. A method of making a semiconductor device, comprising:
- providing a bridge die including a photonic circuit;
- depositing an optical epoxy over the photonic circuit;
- depositing an encapsulant over the bridge die; and
- removing a portion of the encapsulant to expose the optical epoxy.

8. The method of claim 7, further including:
- disposing the bridge die over an interconnect structure; and
- depositing the encapsulant over the bridge die and interconnect structure.

9. The method of claim 7, further including forming an interconnect structure over the bridge die and encapsulant, wherein the interconnect structure includes an opening over the photonic circuit.

10. The method of claim 9, further including disposing a first semiconductor die and second semiconductor die over the interconnect structure, wherein the first semiconductor die is electrically coupled to the second semiconductor die through the bridge die.

11. The method of claim 7, further including:
- disposing a dam on the bridge die around the photonic circuit; and
- dispensing the optical epoxy into an area surrounded by the dam.

12. The method of claim 7, wherein the bridge die includes a conductive via.

13. A method of making a semiconductor device, comprising:
- providing a bridge die including a photonic circuit;
- depositing an encapsulant over the bridge die; and
- removing a portion of the encapsulant to expose the photonic circuit.

14. The method of claim 13, further including removing the portion of encapsulant by backgrinding.

15. The method of claim 14, further including disposing a cover over the photonic circuit, wherein backgrinding removes a portion of the cover.

16. The method of claim 15, further including removing a second portion of the cover after backgrinding.

17. The method of claim 15, wherein backgrinding removes a top of the cover while leaving a sidewall of the cover.

18. The method of claim 13, further including disposing a first semiconductor die and second semiconductor die over the bridge die and encapsulant, wherein the first semiconductor die is electrically coupled to the second semiconductor die through the bridge die.

19. The method of claim 13, further including backgrinding the bridge die to expose a conductive via of the bridge die.

20. A semiconductor device, comprising:
- a bridge die including a photonic circuit;
- an optical epoxy deposited over the photonic circuit; and
- an encapsulant deposited over the bridge die with the optical epoxy exposed from the encapsulant.

21. The semiconductor device of claim 20, further including an interconnect structure with the bridge die disposed over the interconnect structure.

22. The semiconductor device of claim 20, further including an interconnect structure formed over the bridge die and encapsulant, wherein the interconnect structure includes an opening over the photonic circuit.

23. The semiconductor device of claim 22, further including a first semiconductor die and second semiconductor die disposed over the interconnect structure, wherein the first semiconductor die is electrically coupled to the second semiconductor die through the bridge die.

24. The semiconductor device of claim 20, further including a dam disposed on the bridge die around the photonic circuit, wherein the optical epoxy is contained within the dam.

25. The semiconductor device of claim 20, wherein the bridge die includes a conductive via.

* * * * *